United States Patent
Browne et al.

(10) Patent No.: US 11,164,109 B2
(45) Date of Patent: Nov. 2, 2021

(54) ARTIFICIAL INTELLIGENCE ENGINE FOR MIXING AND ENHANCING FEATURES FROM ONE OR MORE TRAINED PRE-EXISTING MACHINE-LEARNING MODELS

(71) Applicant: Microsoft Technology Licensing, LLC, Redmond, WA (US)

(72) Inventors: Keen McEwan Browne, Berkeley, CA (US); Marcos Campos, Carlsbad, CA (US); Megan Adams, San Francisco, CA (US); Mark Hammond, Berkeley, CA (US); Matthew Brown, Berkeley, CA (US); Tod Frye, El Ceritto, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 812 days.

(21) Appl. No.: 16/009,153

(22) Filed: Jun. 14, 2018

(65) Prior Publication Data
US 2018/0293517 A1   Oct. 11, 2018

Related U.S. Application Data

(63) Continuation-in-part of application No. 15/417,086, filed on Jan. 26, 2017, now Pat. No. 10,803,401.
(Continued)

(51) Int. Cl.
*G06N 20/00* (2019.01)
*G06F 16/951* (2019.01)
(Continued)

(52) U.S. Cl.
CPC .......... *G06N 20/00* (2019.01); *G06F 3/0482* (2013.01); *G06F 8/31* (2013.01); *G06F 8/311* (2013.01);
(Continued)

(58) Field of Classification Search
CPC .......... G06N 20/00; G06N 3/008; G06N 3/04; G06N 3/0454; G06N 3/08; G06N 3/105;
(Continued)

(56) References Cited

U.S. PATENT DOCUMENTS

| | | |
|---|---|---|
| 5,619,618 A | 4/1997 | Bigus |
| 6,449,603 B1 | 9/2002 | Hunter |

(Continued)

FOREIGN PATENT DOCUMENTS

| | | |
|---|---|---|
| CN | 101645083 A | 2/2010 |
| CN | 102141991 A | 8/2011 |

(Continued)

OTHER PUBLICATIONS

"Final Office Action Issued in U.S. Appl. No. 15/416,970", dated Mar. 3, 2020, 7 Pages.
(Continued)

*Primary Examiner* — William D Titcomb
(74) *Attorney, Agent, or Firm* — Alleman Hall Creasman & Tuttle LLP

(57) ABSTRACT

An AI engine having an architect module to create a number of nodes and how the nodes are connected in a graph of concept nodes that make up a resulting AI model. The architect module also creates a first concept node by wrapping an external entity of code into a software container with an interface configured to exchange information in a protocol of a software language used by the external entity of code. The architect module also creates a second concept node derived from its description in a scripted file coded in a pedagogical programming language, and connects the second concept node into the graph of nodes in the resulting AI model.

20 Claims, 17 Drawing Sheets

Related U.S. Application Data

(60) Provisional application No. 62/287,861, filed on Jan. 27, 2016, provisional application No. 62/524,381, filed on Jun. 23, 2017, provisional application No. 62/547,339, filed on Aug. 18, 2017, provisional application No. 62/555,584, filed on Sep. 7, 2017.

(51) Int. Cl.

| | | |
|---|---|---|
| *G06F 16/22* | (2019.01) | |
| *G06F 8/38* | (2018.01) | |
| *G06Q 10/00* | (2012.01) | |
| *G06N 3/10* | (2006.01) | |
| *G06F 30/20* | (2020.01) | |
| *G06F 8/30* | (2018.01) | |
| *G06N 3/08* | (2006.01) | |
| *G06N 3/04* | (2006.01) | |
| *H04L 29/06* | (2006.01) | |
| *G06F 9/451* | (2018.01) | |
| *G06F 3/0482* | (2013.01) | |
| *G06N 3/00* | (2006.01) | |
| *G06N 5/04* | (2006.01) | |
| *G06F 9/48* | (2006.01) | |
| *G06F 15/80* | (2006.01) | |
| *G06K 9/62* | (2006.01) | |
| *G06F 30/333* | (2020.01) | |
| *G06F 40/166* | (2020.01) | |
| *G06F 3/0354* | (2013.01) | |

(52) U.S. Cl.
CPC ............... *G06F 8/38* (2013.01); *G06F 9/451* (2018.02); *G06F 9/4881* (2013.01); *G06F 15/80* (2013.01); *G06F 16/2228* (2019.01); *G06F 16/951* (2019.01); *G06F 30/20* (2020.01); *G06K 9/6257* (2013.01); *G06N 3/008* (2013.01); *G06N 3/04* (2013.01); *G06N 3/0454* (2013.01); *G06N 3/08* (2013.01); *G06N 3/105* (2013.01); *G06N 5/04* (2013.01); *G06Q 10/00* (2013.01); *H04L 67/42* (2013.01); *G06F 3/03543* (2013.01); *G06F 30/333* (2020.01); *G06F 40/166* (2020.01)

(58) Field of Classification Search
CPC ....... G06N 5/04; G06F 9/451; G06F 16/2228; G06F 16/951; G06F 30/20; G06F 3/0482; G06F 8/31; G06F 8/311; G06F 8/38; G06F 9/4881; G06F 15/80; G06F 9/6257; G06Q 10/10; H04L 67/42
USPC ....................................................... 706/12
See application file for complete search history.

(56) References Cited

U.S. PATENT DOCUMENTS

| | | | |
|---|---|---|---|
| 7,386,522 | B1 | 6/2008 | Bigus et al. |
| 8,442,839 | B2 | 5/2013 | Yen et al. |
| 8,521,664 | B1 | 8/2013 | Lin et al. |
| 9,443,192 | B1 | 9/2016 | Cosic |
| 9,460,088 | B1 | 10/2016 | Sak et al. |
| 9,524,461 | B1 | 12/2016 | Huynh |
| 9,558,454 | B2 * | 1/2017 | Strassner ................. G06N 5/02 |
| 10,586,173 | B2 * | 3/2020 | Hammond ............. G06N 20/00 |
| 10,800,040 | B1 | 10/2020 | Beckman et al. |
| 10,990,894 | B2 * | 4/2021 | Shaashua ................ H04L 67/22 |
| 2003/0004672 | A1 | 1/2003 | Thurman |
| 2003/0204311 | A1 | 10/2003 | Bush |
| 2004/0122788 | A1 | 6/2004 | Griffith et al. |
| 2004/0255291 | A1 | 12/2004 | Sierer et al. |
| 2005/0034109 | A1 | 2/2005 | Hamilton et al. |
| 2005/0114280 | A1 | 5/2005 | Rising, III |
| 2005/0132032 | A1 | 6/2005 | Bertrand |
| 2005/0197991 | A1 | 9/2005 | Wray et al. |
| 2006/0166174 | A1 | 7/2006 | Rowe et al. |
| 2006/0218107 | A1 | 9/2006 | Young |
| 2009/0106165 | A1 | 4/2009 | Solomon |
| 2009/0106178 | A1 | 4/2009 | Chu |
| 2009/0119587 | A1 | 5/2009 | Allen et al. |
| 2009/0204563 | A1 | 8/2009 | Gerber et al. |
| 2010/0088258 | A1 | 4/2010 | Oaten et al. |
| 2010/0094790 | A1 | 4/2010 | Gnojewski |
| 2010/0106714 | A1 | 4/2010 | Lim et al. |
| 2012/0159090 | A1 | 6/2012 | Andrews et al. |
| 2012/0209794 | A1 | 8/2012 | Jones, III |
| 2012/0239598 | A1 | 9/2012 | Cascaval et al. |
| 2015/0066929 | A1 | 3/2015 | Satzke et al. |
| 2015/0339570 | A1 | 11/2015 | Scheffler |
| 2016/0034809 | A1 | 2/2016 | Trenholm et al. |
| 2016/0283202 | A1 | 9/2016 | Sellers-blais |
| 2016/0358098 | A1 | 12/2016 | Duesterwald et al. |
| 2017/0061283 | A1 | 3/2017 | Rasmussen et al. |
| 2017/0091670 | A1 | 3/2017 | Gulin et al. |
| 2017/0193361 | A1 | 7/2017 | Chilimbi et al. |
| 2017/0213126 | A1 | 7/2017 | Hammond et al. |
| 2017/0213128 | A1 | 7/2017 | Hammond et al. |
| 2017/0213131 | A1 | 7/2017 | Hammond et al. |
| 2017/0213132 | A1 | 7/2017 | Hammond et al. |
| 2017/0213154 | A1 | 7/2017 | Hammond et al. |
| 2017/0213155 | A1 | 7/2017 | Hammond et al. |
| 2017/0213156 | A1 | 7/2017 | Hammond et al. |
| 2017/0262769 | A1 | 9/2017 | Mcshane et al. |
| 2017/0308800 | A1 | 10/2017 | Cichon et al. |
| 2018/0060759 | A1 | 3/2018 | Chu et al. |
| 2018/0191867 | A1 | 7/2018 | Siebel et al. |
| 2018/0240062 | A1 | 8/2018 | Crabtree et al. |
| 2018/0293463 | A1 | 10/2018 | Brown |
| 2018/0293493 | A1 | 10/2018 | Kalamkar et al. |
| 2018/0293498 | A1 | 10/2018 | Campos et al. |
| 2018/0307945 | A1 | 10/2018 | Haigh et al. |
| 2018/0357047 | A1 * | 12/2018 | Brown ..................... G06N 3/08 |
| 2018/0357152 | A1 * | 12/2018 | Browne ............. G06F 11/3692 |
| 2018/0357543 | A1 * | 12/2018 | Brown ................ G06F 16/9024 |
| 2018/0357552 | A1 * | 12/2018 | Campos .................. G06N 5/043 |
| 2020/0250583 | A1 | 8/2020 | Hammond et al. |

FOREIGN PATENT DOCUMENTS

| | | |
|---|---|---|
| CN | 102222005 A | 10/2011 |
| CN | 102591654 A | 7/2012 |
| CN | 102707982 A | 10/2012 |
| CN | 104106276 A | 10/2014 |
| CN | 105068661 A | 11/2015 |
| WO | 2015017706 A2 | 2/2015 |

OTHER PUBLICATIONS

"Final Office Action Issued in U.S. Appl. No. 15/417,086", dated Feb. 25, 2020, 18 Pages.
"Non Final Office Action Issued in U.S. Appl. No. 16/009,039", dated Dec. 14, 2020, 32 Pages.
Luchian et al., "Automation of the infrastructure and services for an OpenStack deployment using chef tool", In 15th RoEduNet Conference: Networking in Education and Research, IEEE, Sep. 7, 2016, 5 Pages.
"Non Final Office Action Issued in U.S. Appl. No. 16/008,751", dated Dec. 1, 2020, 26 Pages.
"Summons to attend oral proceedings Issued in European Patent Application No. 17745016.0", Mailed Date: Oct. 23, 2020, 7 Pages.
Ciancio et al., "Heuristic techniques to optimize neural network architecture in manufacturing applications", In Journal of Neural Computing and Applications vol. 27, Issue 7, Jul. 31, 2015, pp. 2001-2015.
"Build, Ship, Run Any App, Anywhere", Retrieved From: https://web.archive.org/web/20170120165452/https://www.docker.com/, Retrieved On: Jan. 20, 2017, 7 Pages.
"Services Overview", Published By Bonsai AI, Inc, 3 Pages.
"What's the Difference Between an Application, Process, and Services?", Retrieved From: https://superuser.com/questions/209654/

(56) References Cited

OTHER PUBLICATIONS whats-the-difference-between-an-application-process-and-services, Retrieved On: Jan. 20, 2017, 1 Page.
Campos, et al., "Concept Network Reinforcement Learning For Flexible Dexterous Manipulation", Retrieved From: https://medium.com/@BonsaiAI/concept-network-reinforcement-learning-for-flexible-dexterous-manipulation-47bf459b19b9, Sep. 19, 2017, 11 Pages.
Chung, Kiuk, "Generating Recommendations at Amazon Scale With Apache Spark and Amazon DSSTNE", Retrieved From: https://aws.amazon.com/blogs/big-data/generating-recommendations-at-amazon-scale-with-apache-spark-and-amazon-dsstne/, Jul. 9, 2016, 8 Pages.
Dunn, Jeffrey, "Introducing FBLearner Flow: Facebook's AI Backbone", Retrieved From: https://web.archive.org/web/20180717150507/https://code.fb.com/core-data/introducing-fblearner-flow-facebooks-ai-backbone/, May 9, 2016, 9 Pages.
Gray, Kathryn E . . . , "Toward Customizable Pedagogic Programming Languages", A dissertation submitted to the faculty of the University of Utah in partial fulfillment of the requirements for the degree of Doctor of Philosophy in Computer Science, Aug. 2006, 156 Pages.
Gudimella, et al., "Deep Reinforcement Learning for Dexterous Manipulation With Concept Networks", Retrieved From: https://arxiv.org/pdf/1709.06977.pdf, Sep. 20, 2017, 16 Pages.
Hammond, et al., "AI For Everyone: An Introduction to Bonsai BRAIN and Inkling", In Bonsai AI, Inc. Whitepaper, Jan. 2016, 16 Pages.
He, Jinru, "Auto Scaling Pinterest", Retrieved From: https://web.archive.org/web/20161114182239/https://engineering.pinterest.com/blog/auto-scaling-pinterest, Sep. 16, 2016, 8 Pages.
Ma, Kevin, "Applying Deep Learning to Related Pins", Retrieved From: https://web.archive.org/web/20170214195127/https://engineering.pinterest.com/blog/applying-deep-learning-related-pins, Jan. 12, 2017, 6 Pages.
"International Search Report and Written Opinion Issued in PCT Application No. PCT/US2017/015446", dated Apr. 10, 2017, 6 Pages.
"International Search Report and Written Opinion Issued in PCT Application No. PCT/US2017/015460", dated May 5, 2017, 11 Pages.
"International Search Report and Written Opinion Issued in PCT Application No. PCT/US2017/015470", dated Apr. 21, 2017, 11 Pages.
Raschka, Sebastian, "Fitting a Model Via Closed-Form Equations Vs. Gradient Descent Vs Stochastic Gradient Descent Vs Mini-Batch Learning. What is the Difference?", Retrieved From: https://sebastianraschka.com/faq/docs/closed-form-vs-gd.html, Retrieved From: Jan. 17, 2017, 6 Pages.
Tessler, et al., "A Deep Hierarchical Approach to Lifelong Learning in Minecraft", Retrieved From: https://arxiv.org/pdf/1604.07255.pdf, Nov. 30, 2016, 10 Pages.

"Non Final Office Action Issued in U.S. Appl. No. 15/416,988", dated Oct. 3, 2019, 11 Pages.
"Non Final Office Action Issued in U.S. Appl. No. 15/417,056", dated Oct. 17, 2019, 10 Pages.
"Non Final Office Action Issued in U.S. Appl. No. 15/417,086", dated Nov. 7, 2019, 13 Pages.
Beale, et al., "Neural Network Toolbox 7 User's Guide", Retrieved from http://citeseerx.ist.psu.edu/viewdoc/download?doi=10.1.1.220.1640&rep=rep1&type=pdf, 2010, 951 Pages.
"Non Final Office Action Issued in U.S. Appl. No. 15/416,970", dated Nov. 21, 2019, 12 Pages.
"Non Final Office Action Issued in U.S. Appl. No. 15/417,033", dated Nov. 26, 2019, 13 Pages.
Hengst, Bernhard, "Safe State Abstraction and Reusable Continuing Subtasks in Hierarchical Reinforcement Learning", In Proceedings of 20th Joint Conference on Artificial Intelligence, Dec. 2, 2007, 11 Pages.
"International Search Report & Written Opinion Issued in PCT Application No. PCT/US2018/037650", dated Aug. 31, 2018, 10 Pages.
"First Office Action and Search Report Issued in Chinese Patent Application No. 201780020322.4", dated Apr. 2, 2021, 12 Pages.
Arendt, et al., "A Tool Environment for Quality Assurance based on the Eclipse Modeling Framework", In Journal of Automated Software Engineering, vol. 20, Issue 2, Dec. 11, 2012, pp. 141-184.
Yang, et al., "Intelligent Search Engine Based on Knowledge Library", In Journal of Computer and Information Technology, vol. 18, Issue 2, Apr. 30, 2010, pp. 41-44.
"First Office Action and Search Report Issued in Chinese Patent Application No. 201780020323.9", dated May 24, 2021, 21 Pages.
"Non-Final Office Action Issued in U.S. Appl. No. 15/416,904", dated Aug. 14, 2019, 11 Pages.
"Notice of Allowance Issued in U.S. Appl. No. 15/417,075", dated Aug. 14, 2019, 9 Pages.
"Extended Search Report Issued in European Patent Application No. 17745025.1", dated Aug. 23, 2019, 9 Pages.
"Extended Search Report Issued in European Patent Application No. 17745016.0", dated Aug. 20, 2019, 8 Pages.
"Extended Search Report Issued in European Patent Application No. 17745030.1", dated Sep. 2, 2019, 7 Pages.
"Non-Final Office Action Issued in U.S. Appl. No. 15/416,970", dated Aug. 4, 2020, 7 Pages.
"Office Action Issued in European Patent Application No. 17745016.0", dated Jul. 13, 2020, 9 Pages.
Lirov, Yuval., "Computer Aided Neural Network Engineering", In the Journal of Neural Networks, vol. 5, Issue 4, Jul. 1992, pp. 711-719.
Perera, et al., "ANNEbot: An Evolutionary Artificial Neural Network Framework", In the Proceedings of 4th International Conference on Intelligent and Advanced Systems, Jun. 12, 2012, pp. 40-45.

* cited by examiner

ARTIFICIAL INTELLIGENCE ENGINE FOR MIXING AND ENHANCING FEATURES FROM ONE OR MORE TRAINED PRE-EXISTING MACHINE-LEARNING MODELS

CROSS-REFERENCE

This application is continuation-in-part of U.S. patent application Ser. No. 15/417,086 titled "Artificial Intelligence Engine Having Multiple Independent Processes on a Cloud Based Platform Configured to Scale," filed Jan. 26, 2017, which claims the benefit of U.S. Provisional Application No. 62/287,861, filed Jan. 27, 2016, titled "Bonsai platform, language, and tooling," each of which is incorporated herein by reference in its entirety. This application also claims the benefit under 35 USC 119 of U.S. Provisional Application No. 62/524,381, titled Systems and methods for extending functionality of trained machine learning models, filed Jun. 23, 2017, which is also incorporated herein by reference in its entirety. This application also claims the benefit under 35 USC 119 of U.S. Provisional Application No. 62/547,339, titled "An artificial intelligence engine having multiple improvements," filed Aug. 18, 2017, which is also incorporated herein by reference in its entirety. This application also claims the benefit under 35 USC 119 of U.S. Provisional Application No. 62/555,584, titled "An artificial intelligence engine having multiple improvements," filed Sep. 7, 2017, which is also incorporated herein by reference in its entirety.

NOTICE OF COPYRIGHT

A portion of this disclosure contains material that is subject to copyright protection. The copyright owner has no objection to the facsimile reproduction by anyone of the material subject to copyright protection as it appears in the United States Patent & Trademark Office's patent file or records, but otherwise reserves all copyright rights whatsoever.

FIELD

Embodiments of the design provided herein generally relate to artificial intelligence systems and methods thereof.

BACKGROUND

Artificial intelligence ("AI") has potential to be one of the most impactful technologies of the 21$^{st}$ century and beyond. Unfortunately, software developers currently looking to work with AI must learn complex toolkits, use limited application programming interfaces ("APIs"), use constrained black-box solutions for AI, or some combination thereof. The foregoing limitations must be overcome for software developers and enterprises to solve real-world problems with AI. In addition, with fewer than 20,000 data science experts capable of building AI at its lowest levels, working with AI needs to be made more accessible to the 20 million or more software developers of the software development community. Provided herein are AI systems and methods that address the foregoing.

SUMMARY

Provided in an embodiment is an artificial intelligence ("AI") engine. In an embodiment, an AI engine having multiple independent modules on one or more computing platforms is discussed. The multiple independent modules are configured to have their instructions executed by one or more processors in the one or more computing platforms, and the multiple independent modules are configured to be loaded into one or more memories of the one or more computing platforms.

An architect module can be configured to create a number of nodes and how the nodes are connected in a graph of concept nodes that make up a resulting artificial intelligence model. The graph of concept nodes can be derived from a description in one or more scripted files.

The architect module can also be configured to create a first concept node by wrapping an external entity of code into a software container with an interface configured to exchange information in a protocol of a software language used by the external entity of code. One or more external entities of code can consist of, for example, i) an external AI model coded in different software language natively used by a resulting AI model, ii) an external function having some defined input and output that is coded in different software language natively used by a resulting AI model, iii) a block of code using a Representational State Transfer ("ReST") API, iv) an already trained AI model coded in the software language natively used by the resulting AI model, and v) any combination of these.

The architect module is also configured to create a second concept node derived from its description in a first scripted file, and to connect the second concept node into the graph of nodes in the resulting AI model. A re-use of an external entity of code as the first concept node in the graph making up the resulting AI model allows a creation and training of the resulting AI model with less computing cycles in the AI engine than creating and training all of the concept nodes in the resulting AI model from scratch. Also, the second concept node, coded by the architect module and that needs to be trained, allows deployment of the first concept node embodied in the external entity of code with i) new functionality, ii) extended functionality or iii) a combination of both when combined in the resulting AI model.

These and other features of the design provided herein can be better understood with reference to the drawings, description, and claims, all of which form the disclosure of this patent application.

DRAWINGS

The drawings refer to an embodiment of the design provided herein in which:

FIG. 1A provides a schematic illustrating building, training, and deploying a trained AI model with a neural network in accordance with an embodiment.

Figure 2A:
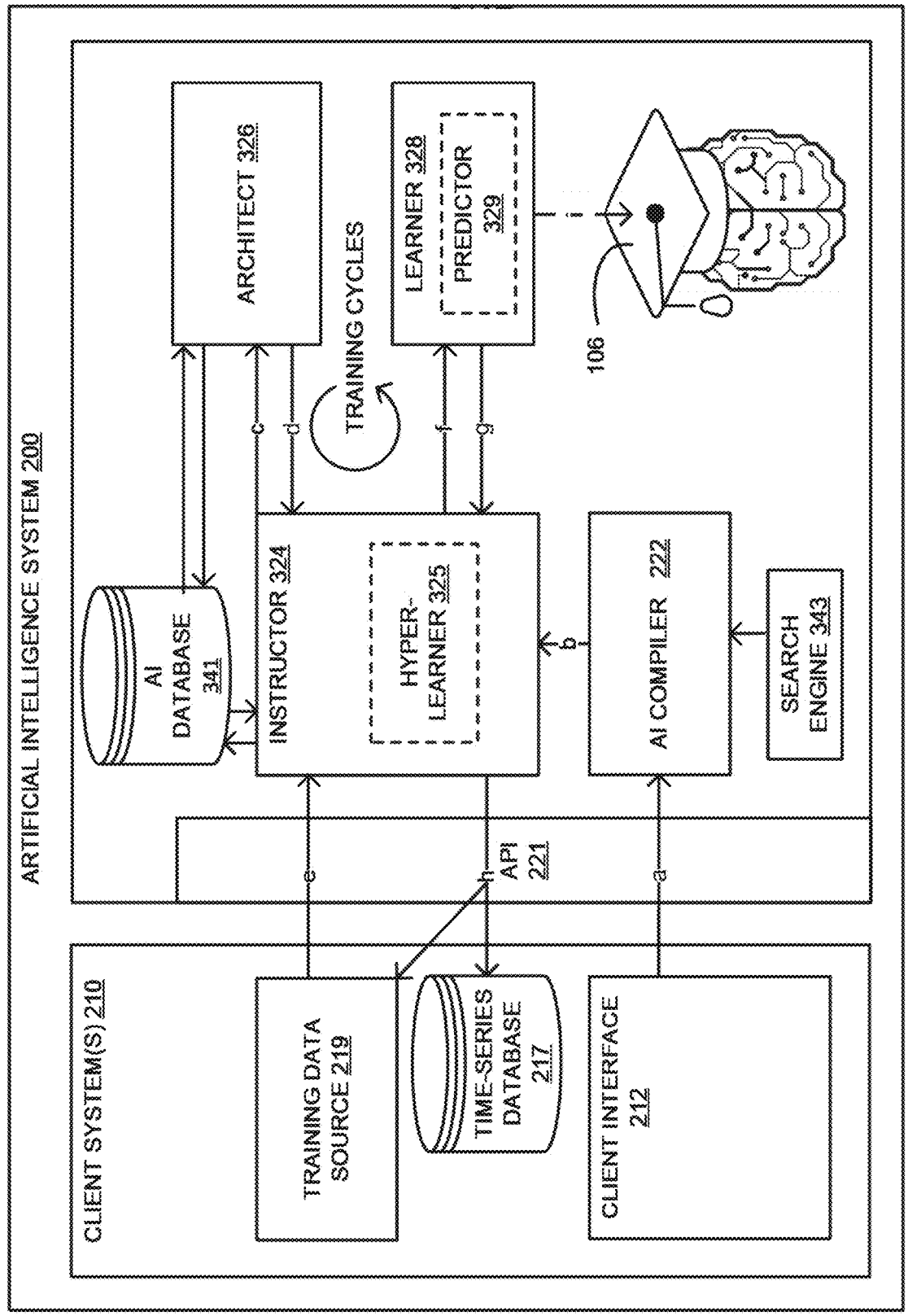

FIG. 2A provides a schematic illustrating an AI engine having multiple independent modules on one or more computing platforms, where the architect module is configured to create one or more concept nodes by wrapping each external entity of code into a software container with an interface configured to exchange information in a protocol of a software language used by that external entity of code in accordance with an embodiment.

Figure 2B:
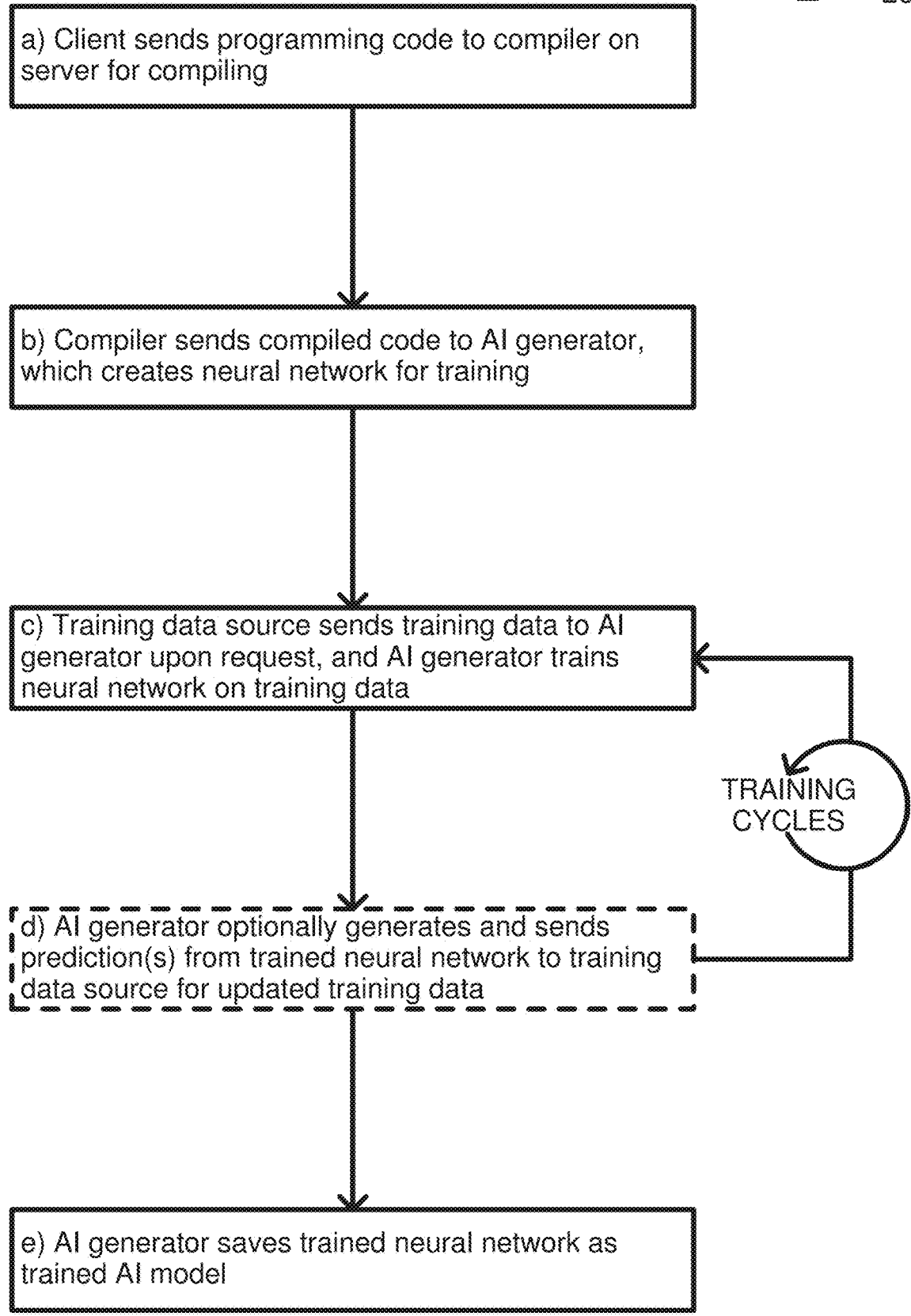

FIG. 2B provides a schematic illustrating a method associated with an AI system in accordance with an embodiment.

Figure 3A:
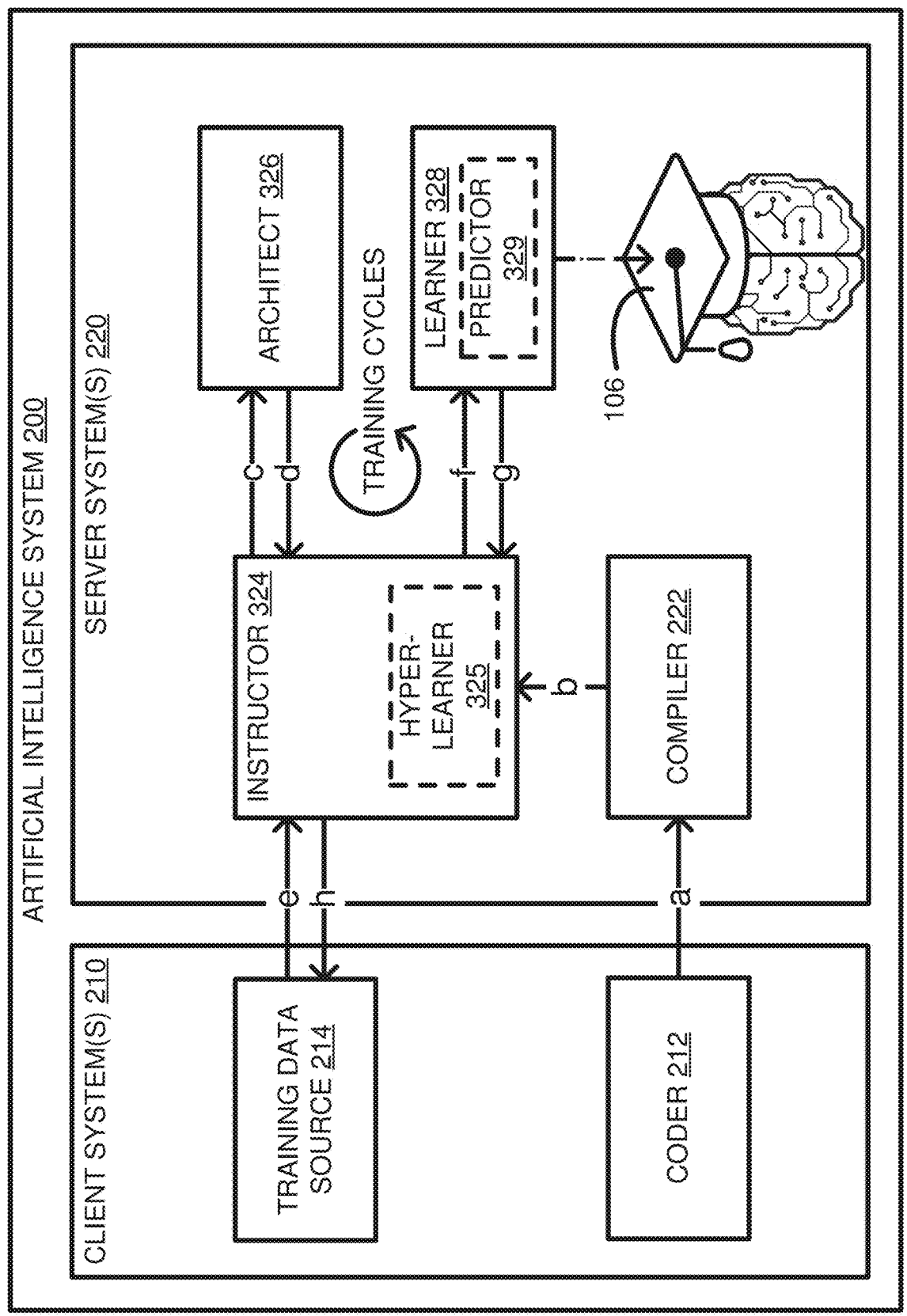

FIG. 3A provides a block diagram illustrating an AI engine using one or more modules to create concept nodes in the graph of nodes, where the concept is derived from its description in a scripted file and coded by the architect module in accordance with an embodiment.

Figure 3B:
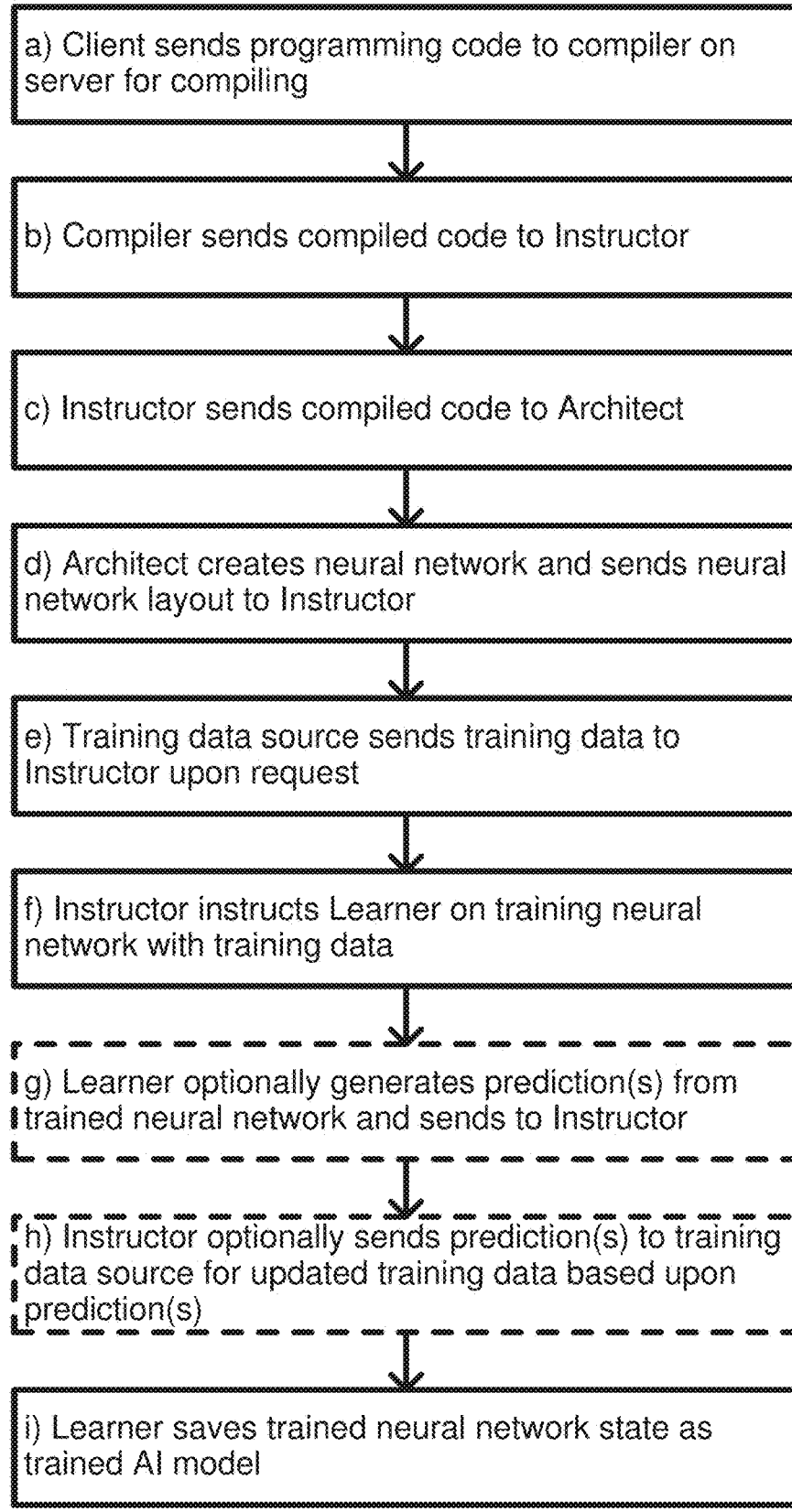

FIG. 3B provides a schematic illustrating a method associated with an AI system in accordance with an embodiment.

Figure 4A:
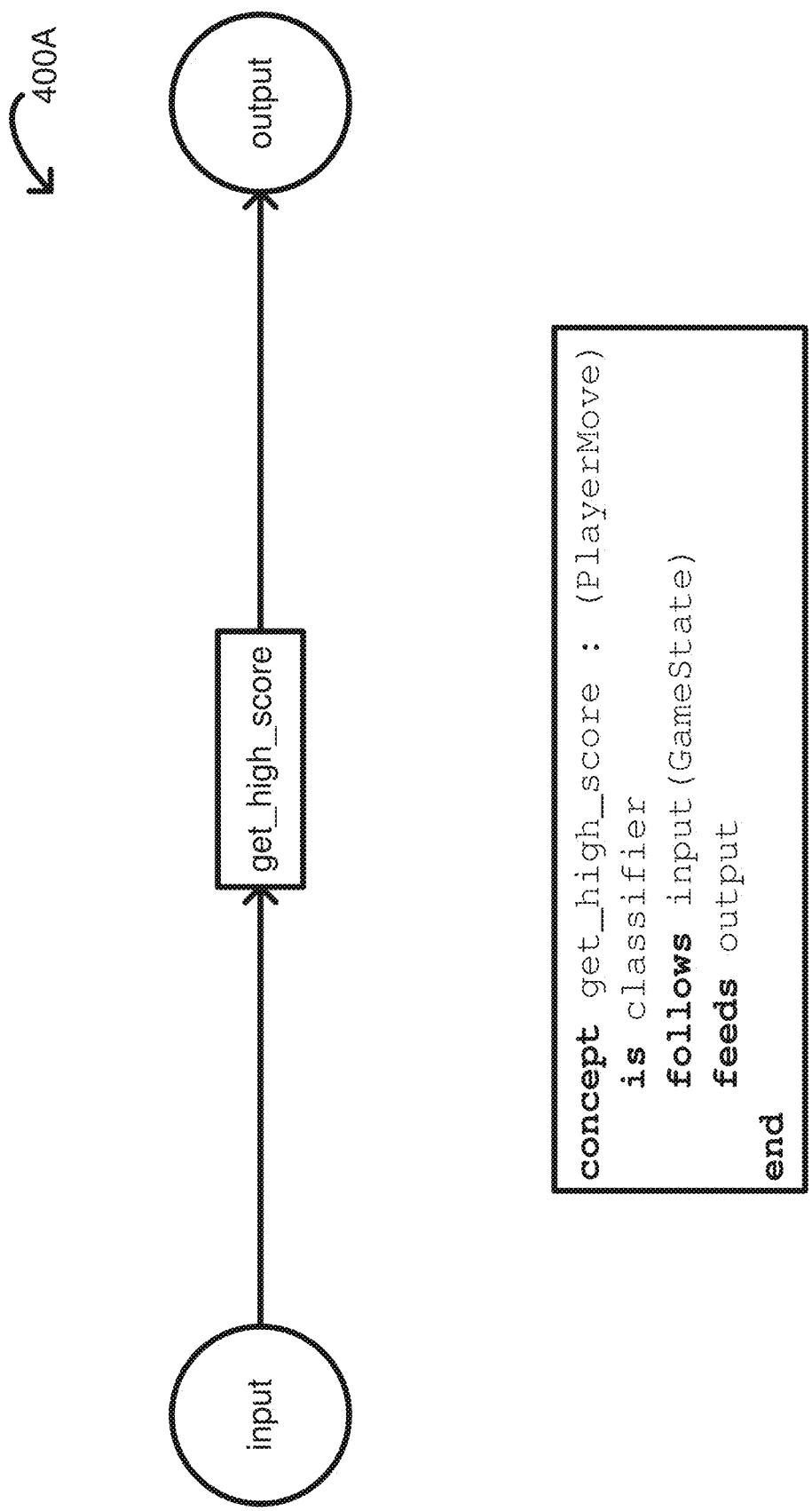

FIG. 4A provides a schematic illustrating a mental model including a concept in accordance with an embodiment.

Figure 4B:
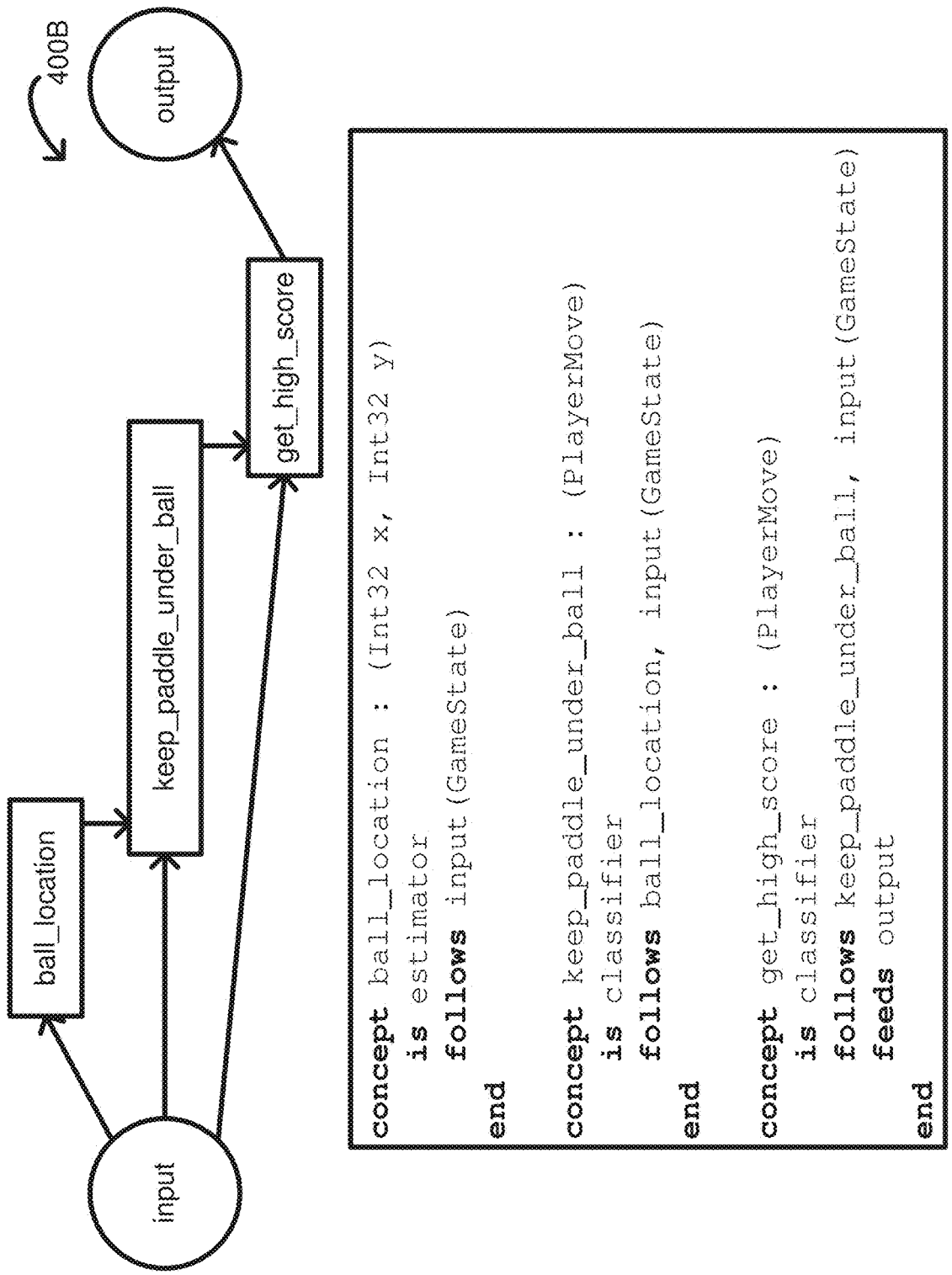

FIG. 4B provides a schematic illustrating a mental model including a number of concepts in accordance with an embodiment.

Figure 5:
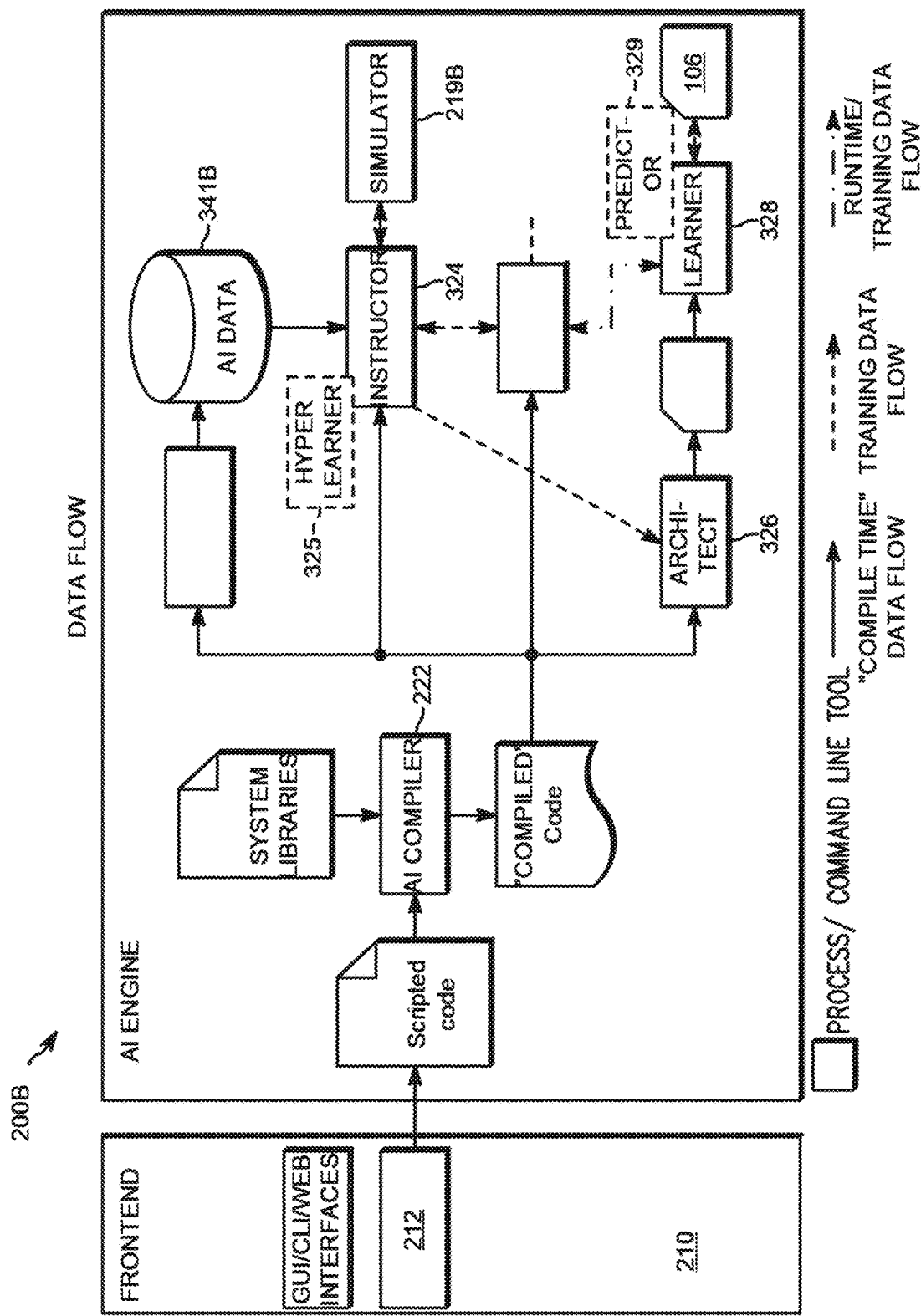

FIG. 5 provides a block diagram of an AI engine using an interface infrastructure to allow uploading of user code and data from their local development environment into the AI engine learning framework, via the user files specified in a file, such as a project file, associated with the container in accordance with an embodiment.

Figure 6A:
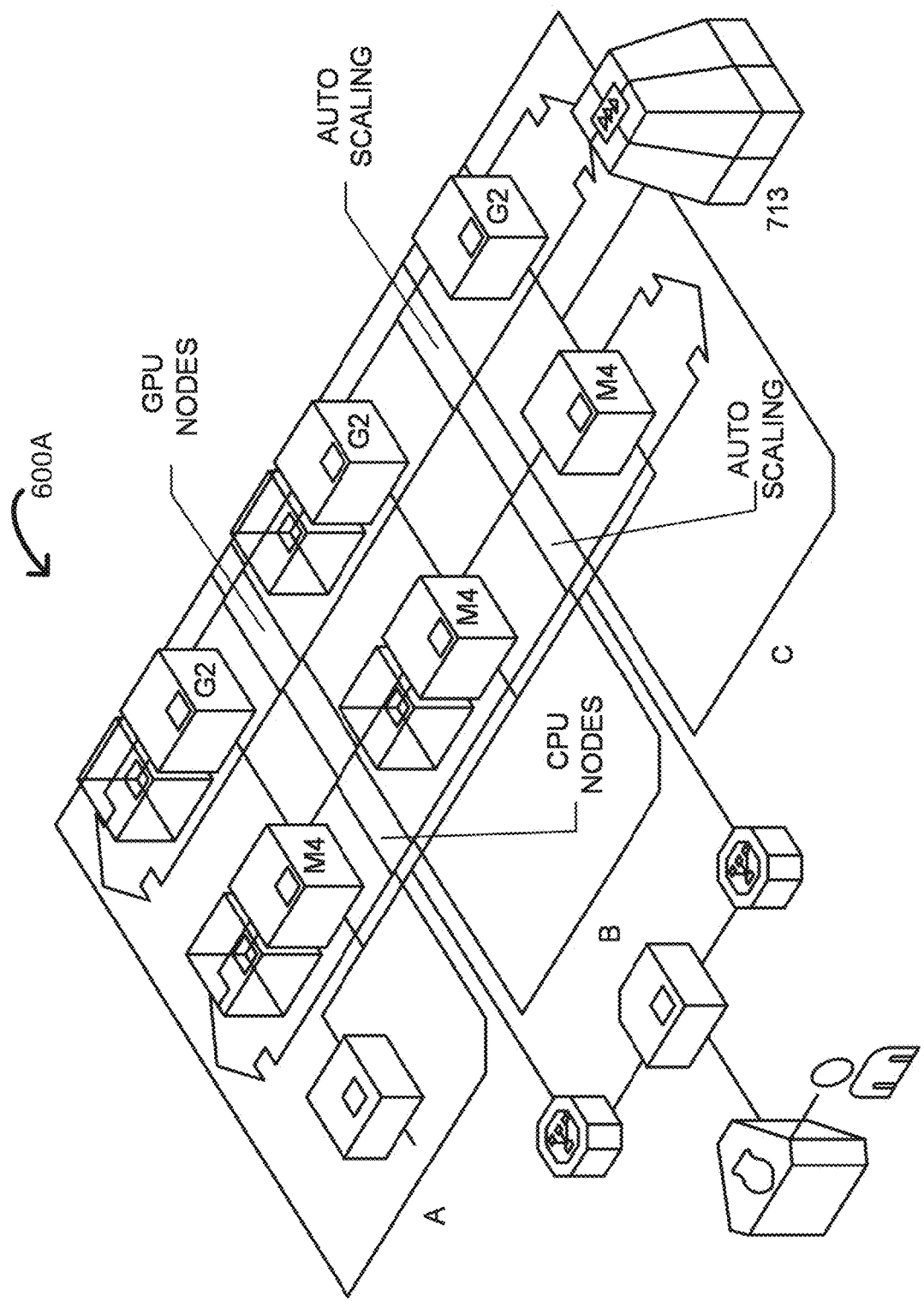

FIG. 6A provides a block diagram illustrating an AI system and its cloud-based computing platforms infrastructure in accordance with an embodiment.

Figure 6B:
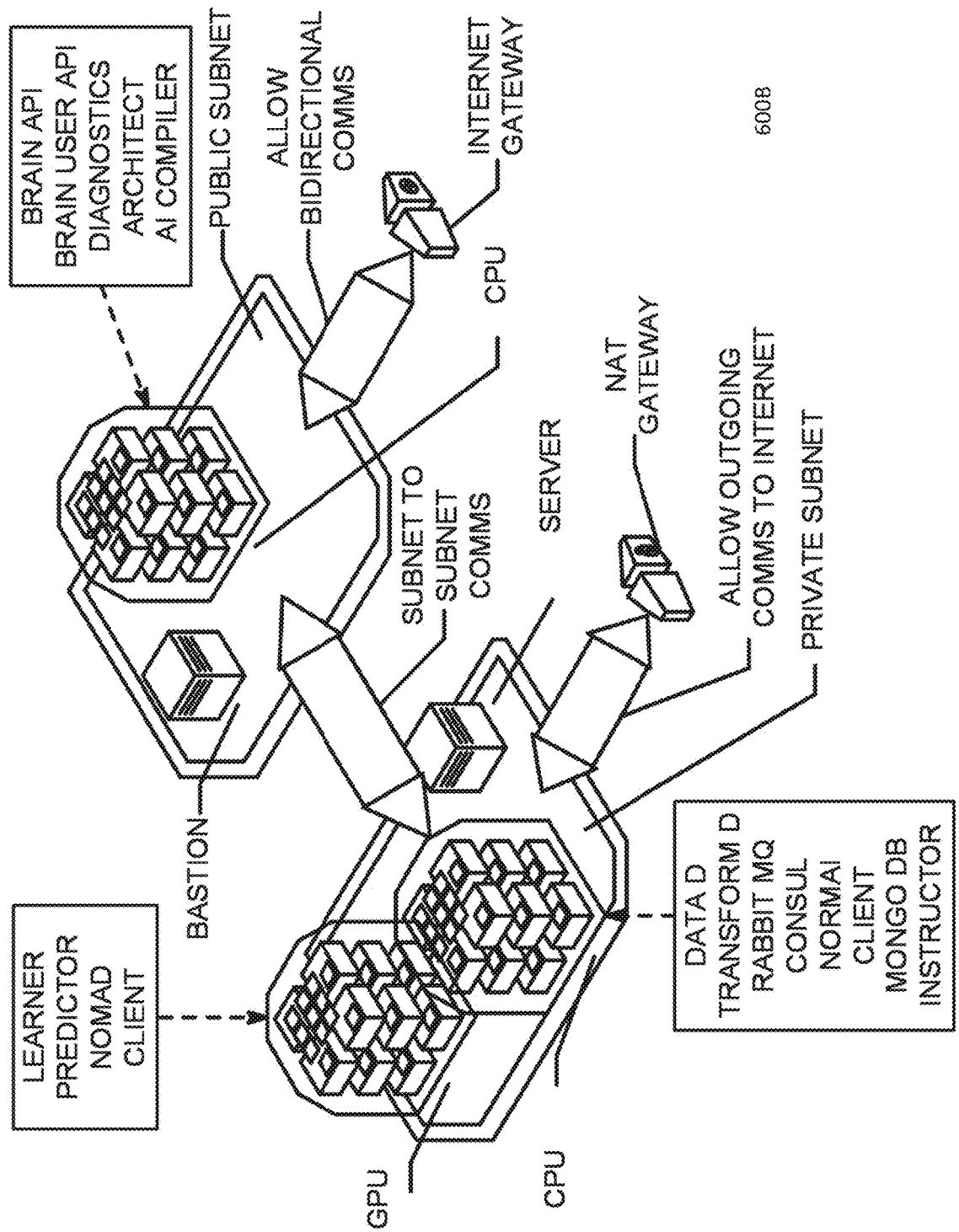

FIG. 6B provides a block diagram illustrating an AI system and its on-premises based computing platforms infrastructure in accordance with an embodiment.

Figure 7:
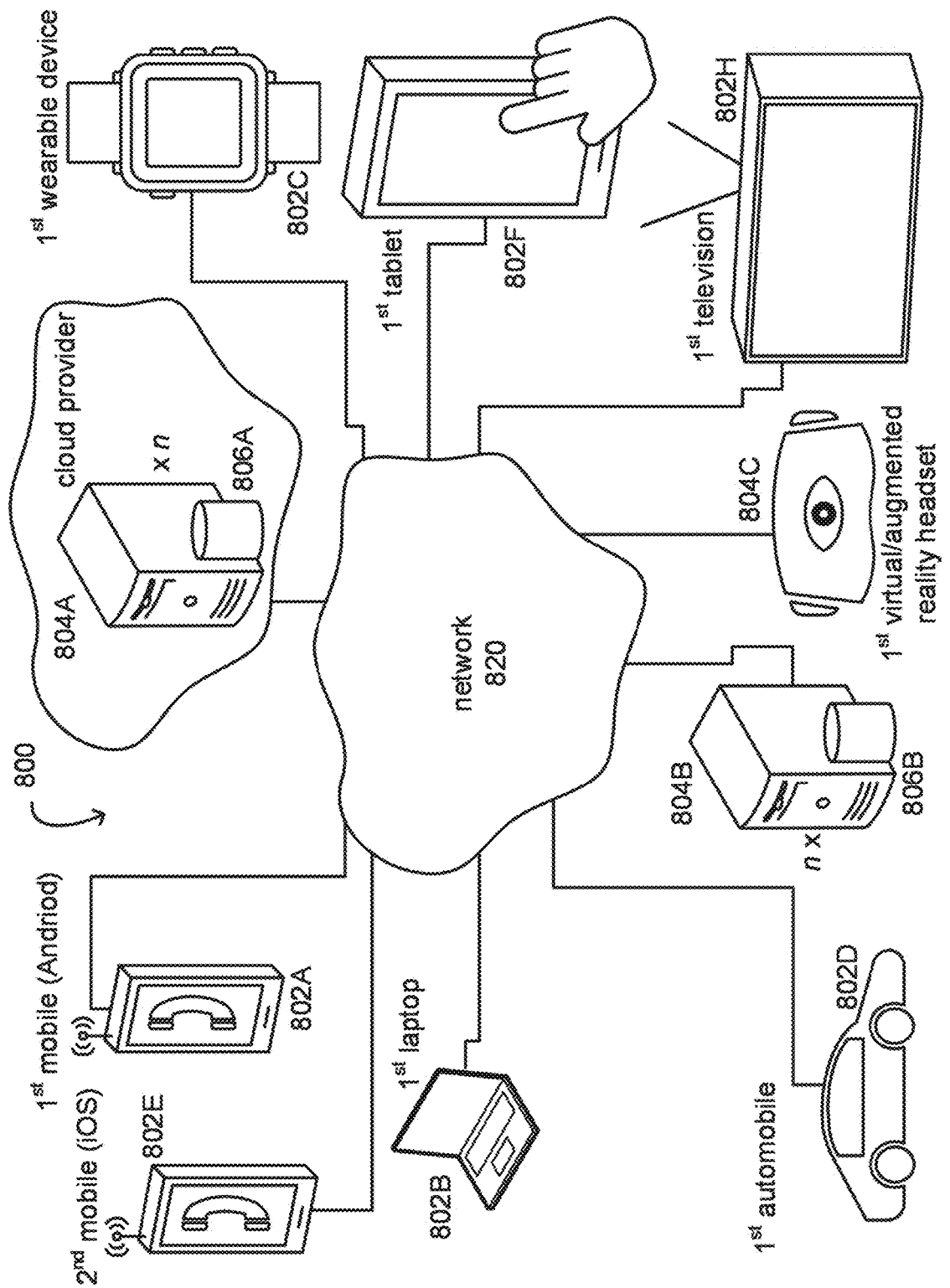

FIG. 7 provides one or more networks in accordance with an embodiment.

Figure 8:
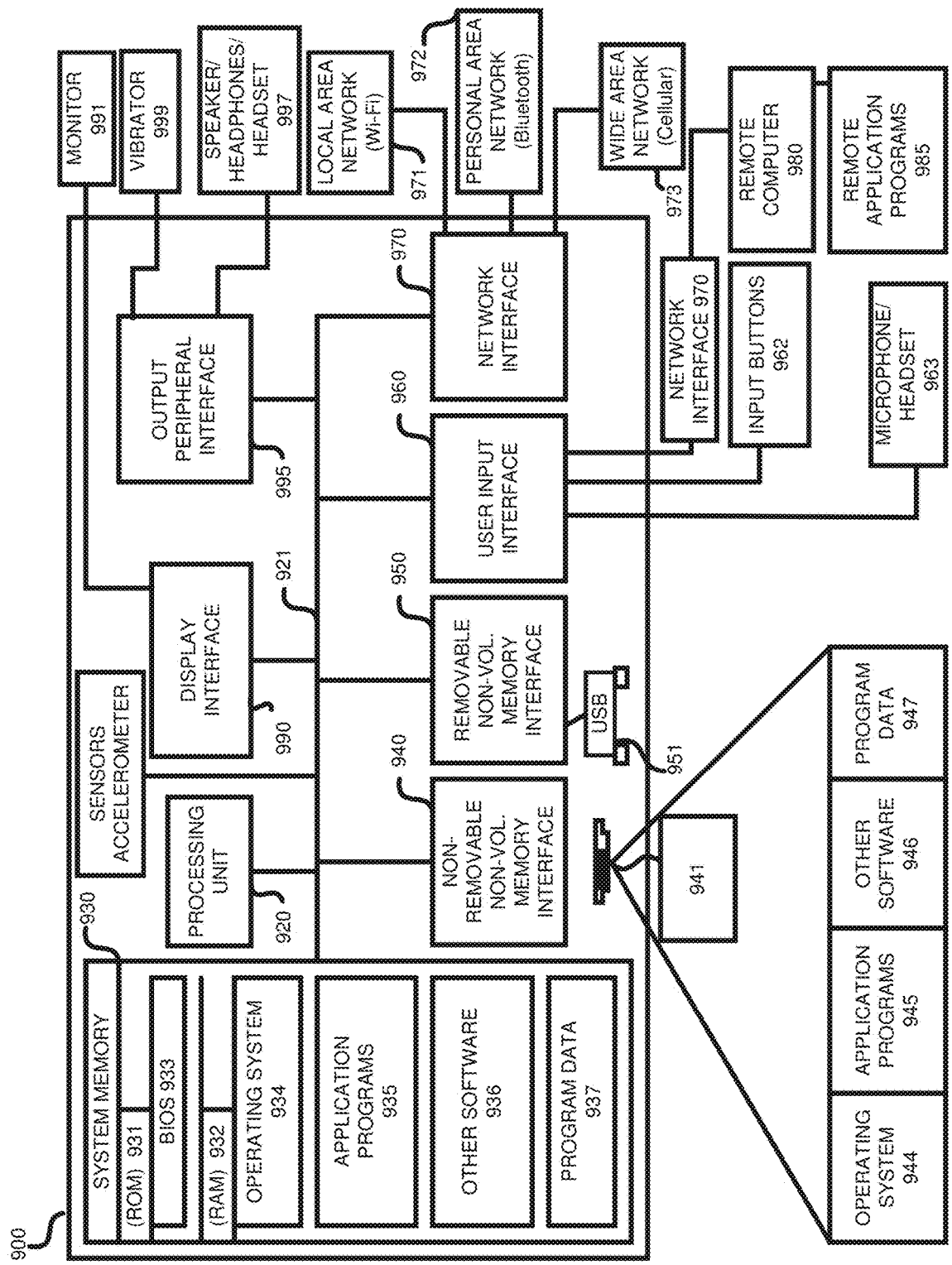

FIG. 8 provides one or more computing systems in accordance with an embodiment.

Figure 9:
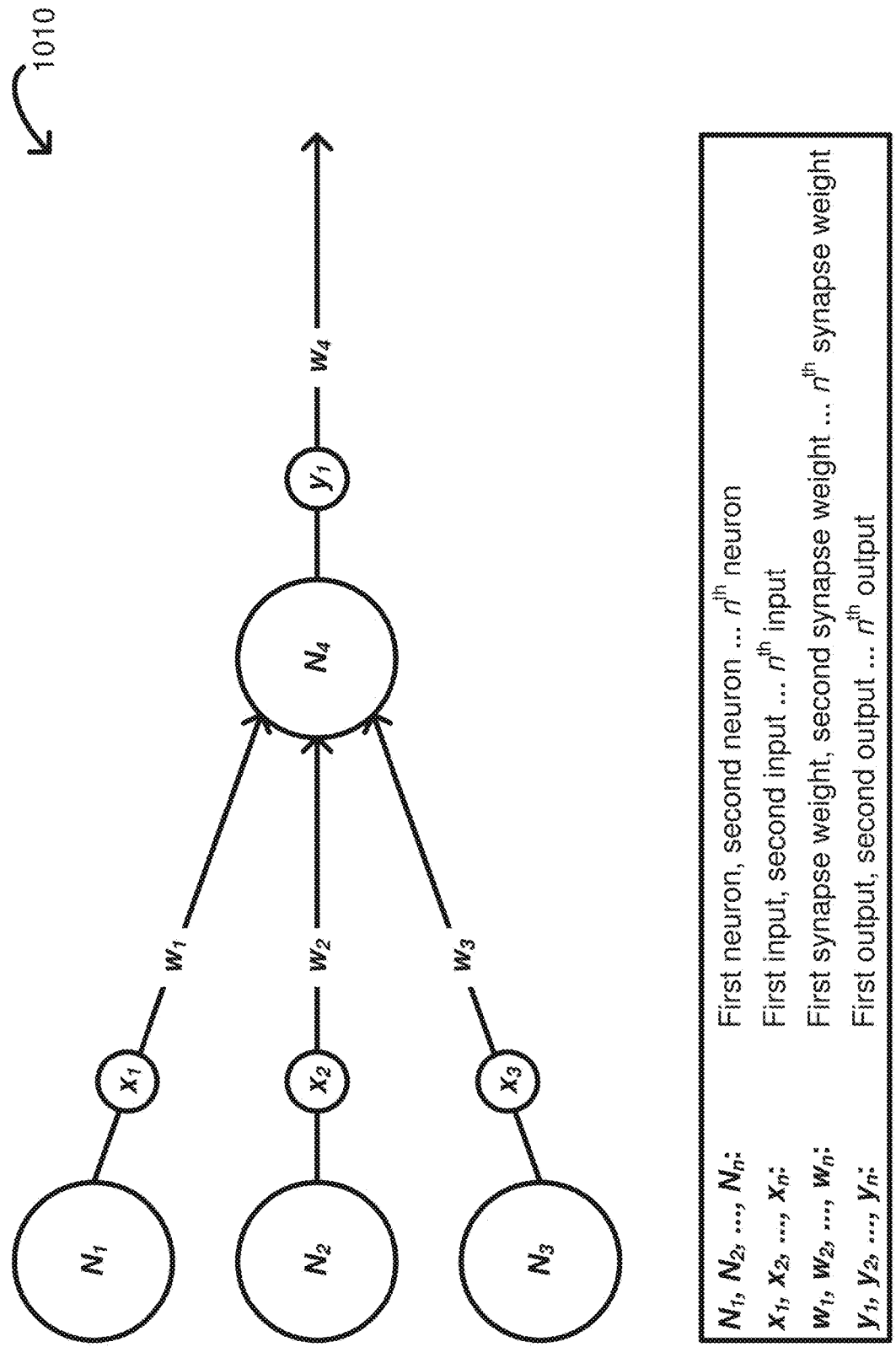

FIG. 9 provides a schematic illustrating a simple artificial neural network.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DESCRIPTION

In the following description, numerous specific details are set forth, such as examples of specific data signals, named components, modules, etc., in order to provide a thorough understanding of the present design. It will be apparent, however, to one of ordinary skill in the art that the present design can be practiced without these specific details. In other instances, well known components or methods have not been described in detail, but rather in a block diagram in order to avoid unnecessarily obscuring the present design. Further, specific numeric references such as a first module, can be made. However, the specific numeric reference should not be interpreted as a literal sequential order, but rather interpreted that the first module is different than a second module. Thus, the specific details set forth are merely exemplary. Also, the features implemented in one embodiment may be implemented in another embodiment where logically possible. The specific details can be varied from and still be contemplated to be within the spirit and scope of the present design. The term "coupled" is defined as meaning connected either directly to the component or indirectly to the component through another component.

In general, an AI engine having multiple independent modules on one or more computing platforms is discussed. The multiple independent modules are configured to have their instructions executed by one or more processors in the one or more computing platforms, and the multiple independent modules are configured to be loaded into one or more memories of the one or more computing platforms.

The AI system uses a task decomposition approach for learning a new task and subtasks can be either learned or provided from the outside in the form of pre-trained pieces or code, such as a Gear.

An architect module can be configured to create a number of nodes and how the nodes are connected in a graph of concept nodes that make up a resulting AI model. The graph of concept nodes can be derived from a description in one or more scripted files. The architect module can be configured to create a first concept node by wrapping an external entity of code into a software container with an interface configured to exchange information in a protocol of a software language used by the external entity of code. One or more external entities of code can consist of i) an external AI model coded in different software language natively used by a resulting AI model, ii) an external function having some defined input and output that is coded in different software language natively used by a resulting AI model, iii) a block of code using a ReST API, iv) an already trained AI model coded in the software language natively used by the resulting AI model, and v) any combination of these.

The architect module is also configured to create a second concept node derived from its description in a first scripted file, and to connect the second concept node into the graph of nodes in the resulting AI model. This creates a mix of concept nodes created by the AI engine from i) parsed files of scripted code and ii) re-use of external entities of code wrapped in a container. A re-use of the external entity of code as the first concept node in the graph making up the resulting AI model allows a creation and training of the resulting AI model with less computing cycles in the AI engine than creating and training all of the concept nodes in the resulting AI model from scratch. The second concept node coded by the architect module that needs to be trained allows deployment of the first concept node embodied in the external entity of code with i) new functionality, ii) extended functionality or iii) a combination of both when combined in the resulting AI model.

Terms

An "AI model" as used herein includes, but is not limited to, neural networks such as recurrent neural networks, recursive neural networks, feed-forward neural networks, convolutional neural networks, deep belief networks, and convolutional deep belief networks; multi-layer perceptions; decision trees; self-organizing maps; deep Boltzmann machines; and Stacked de-noising auto-encoders. The modules of the AI engine are configured to utilize many different machine learning algorithms to generate and/or training a resulting AI model.

Note, each trained AI model itself can be a collection of trained AI objects corresponding to a complex task, that is attempted to be analyzed and solved by the AI model. Where, a set of concepts in a hierarchical structure feed parameters into the complex task. An AI database can index AI objects corresponding to the complex task and the set of concepts making up a given trained AI model so that reuse, recomposition, and reconfiguration of all or part of a trained AI model is possible.

An "artificial neural network" or simply a "neural network" as used herein can include a highly interconnected network of processing elements, each optionally associated with a local memory. The processing elements can be referred to herein as "artificial neural units," "artificial neurons," "neural units," "neurons," "nodes," and the like, while connections between the processing elements can be referred to herein as "synapses," "weights," and the like. A neuron can receive data from an input or one or more other neurons respectively through one or more weighted synapses, process the data, and send processed data to an output or yet one or more other neurons respectively through one or more other weighted synapses. The neural network or one or more neurons thereof can be generated in either hardware, software, or a combination of hardware and software, and the neural network can be subsequently trained.

A module may consist of one or more processes including one or more services, one or more electronic circuits, or a combination of one or more software processes cooperating with the electronic circuits. A software process may be an instance of an executable file configured to perform a task in a finite amount of time (i.e., a job). Thus, each process is configured to operate for a finite amount of time to achieve its configured goal and then shut down until invoked again when needed in the future. Several instances of a same process each wrapped in its own container may run simultaneously on one or more computing devices. A service may be a process, which runs in the background. Each independent process is configured to be aware of the existence of the other processes and knows whom to call and what data and types of inputs that other processes looking for.

A software process may be an instance of an executable file configured to perform a task in a finite amount of time (i.e., a job). Thus, each process is configured to operate for a finite amount of time to achieve its configured goal and then shut down until invoked again when needed in the future. Several instances of a same process each wrapped in its own container may run simultaneously on one or more computing devices. A service may be a process, which runs in the background. Each independent process is configured to be aware of the existence of the other processes and knows whom to call and what data and types of inputs that other processes looking for. Also, functionality performed by one software process may be combined into another software process or migrated in part to another software process. For example, in an embodiment, the 'instructor' and 'learner' processes are merged into a single, combined process running within a single container named the 'scholar.' Thus, the 'instructor' and 'learner' may be implemented as independent processes. Each independent processes running in its own container. However, for performance reasons these 'instructor' and 'learner' processes may be merged into a single, combined process running within a single container named the 'scholar'. The functionality in the 'instructor' and 'learner' is still present as before, just not in independent processes.

Gears

An AI engine may extend functionality of one or more trained machine-learning models. The AI engine includes one or more modules including an architect module, an instructor module, a management module, and a learner module. The management module is configured for managing, deploying, and scaling the one or more trained machine-learning models. The architect module is configured to propose a neural-network layout with one or more neural-network layers from an assembly code. The learner module is configured to build an AI model extending one or more trained machine-learning models using the one or more neural-network layers from the neural-network layout. The instructor module is configured for training the AI model, the one or more trained machine-learning models, or a combination thereof on one or more concept nodes of a mental model to be learned by the AI model, the one or more trained machine-learning models, or the combination thereof using one or more curriculums for the training.

In an embodiment, one or more discrete nodes making up a machine-learning model can be encoded or containerized into its own new concept node; and then, that set of concept nodes is put into a graph of concept nodes intermixed with concept nodes that are new and extend the functionality of the initial machine-learning model.

This Gears design provides data scientists with a tool to manage, deploy, and scale previously developed machine-learning models, including those built with TensorFlow, with the AI engine.

The Gears design (which allows a company's pre-existing code on machine-learning models to be integrated into higher level graph of nodes) brings together state-of-the-art techniques in machine teaching and machine learning. Gears provides enterprises with the tools to more efficiently build application-specific AI models that increase the automation and operational efficiency of industrial systems including robotics, manufacturing, supply chain, logistics, energy, and utilities.

Using Gears, data scientists can now incorporate existing prediction and perception models into the AI engine Platform. In addition to extending the functionality available for programming intelligent control and decision support systems, Gears benefits enterprises by enabling greater collaboration in the development process across programmers, subject matter experts, and data scientists.

Gears can support third parties' existing AI models while extending functionality as needed to address unique and emerging application requirements.

Customers using Gears functionality will benefit from: 1) Compatibility with popular machine-learning frameworks including TensorFlow, Torch, CNTK, scikit learn, and OpenCV; 2) ease of integration of Python libraries and custom code into Bonsai's runtime environment; 3) simplified AI model development and collaboration across teams; 4) a single platform to develop, deploy, and manage all AI models; and 5) combining existing perception and prediction models with state-of-the art reinforcement learning technology.

From a Machine Learning perspective there are tools that have a graph representation (e.g., workflows) of a learning task which include trainable pieces and user defined nodes, which predefined models or user provided code.

The AI engine offers an AI platform that empowers enterprises to build and deploy intelligent systems. By completely automating the management of complex machine-learning libraries and algorithms, the AI engine enables enterprises to program AI models that improve system control and enhance real-time decision support.

Businesses use these models today to increase automation and improve operational efficiency of industrial systems including robotics, manufacturing, supply chain, logistics, energy and utilities.

Figure 1A:
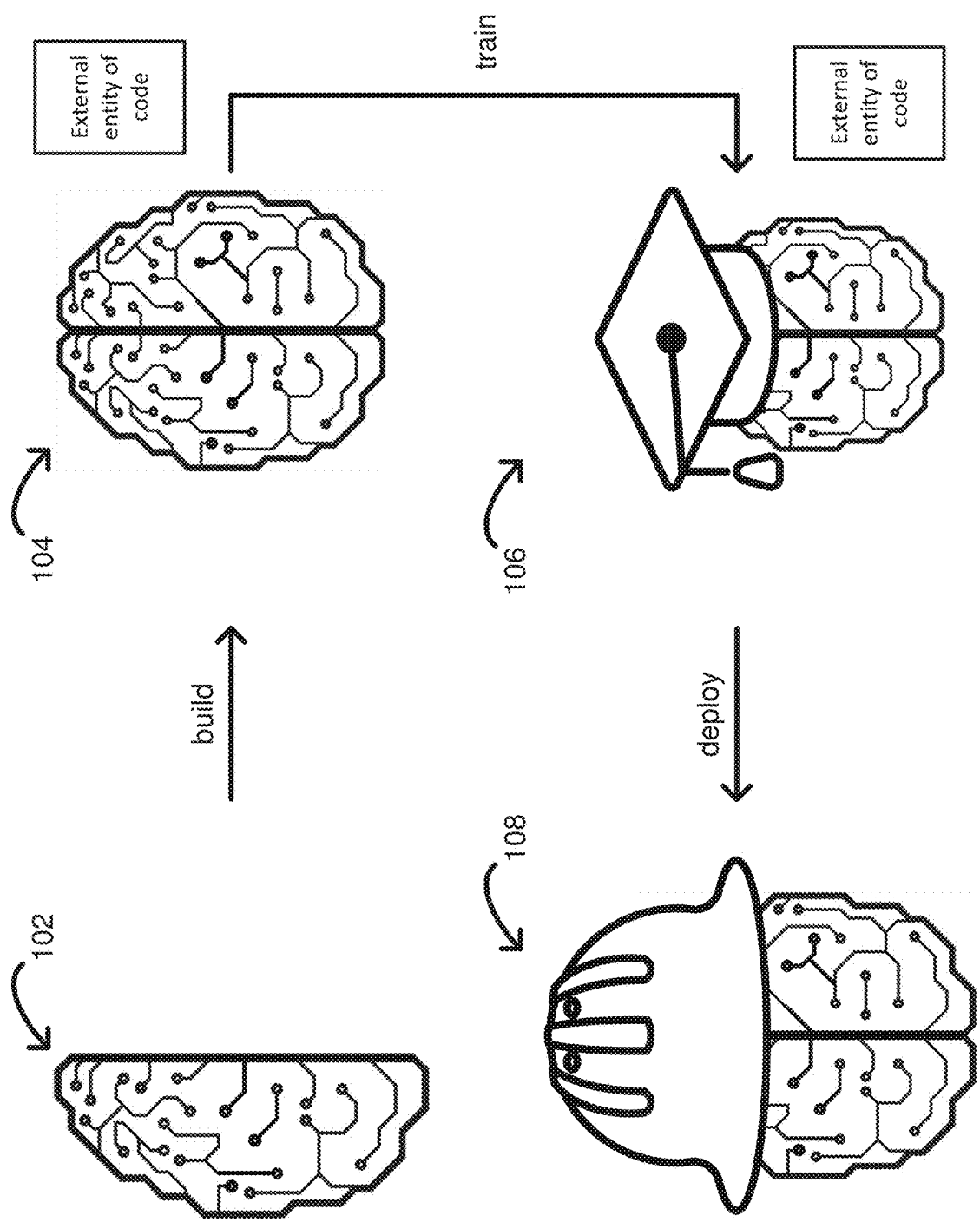
FIG. 1B shows the AI engine decomposing a complex task into smaller, individual concepts into a graph of nodes that includes both i) one or more concepts corresponding to external entities of code and ii) one or more concepts coded in a software language natively used by AI engine and coded by the architect module in accordance with an embodiment.
FIG. 1C illustrates a block diagram of an embodiment of a complex main task and its graph of i) a concept node corresponding to an integrator concept, and ii) two or more levels of concepts corresponding to the individual concepts that hierarchically stem forth from the integrator concept in the graph of the AI model in accordance with an embodiment.
FIG. 1D illustrates a block diagram of an embodiment of a graph of the training of two or more different sub concepts corresponding to the individual concepts in the complex task, in parallel, as well as re-use of the external entities of code in order to lessen the training cycles in accordance with an embodiment.
FIG. 1E illustrates a diagram of an embodiment of an example AI model being utilized by a robotic arm to carry out individual concepts in the complex task.
Figure 1B:
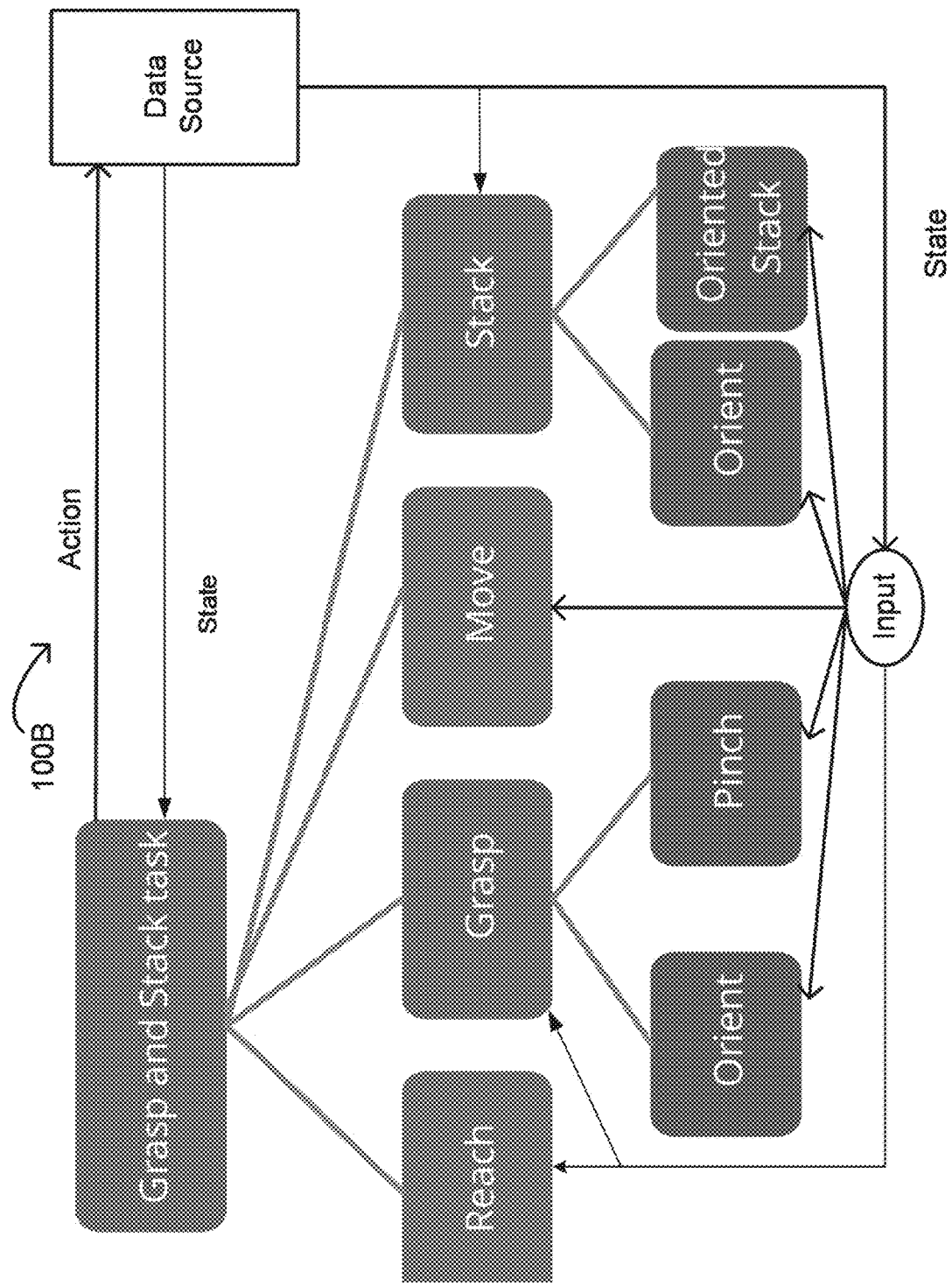

FIG. 1B shows the AI engine decomposing a complex task into smaller, individual concepts into a graph of nodes that includes both i) one or more concepts corresponding to external entities of code and ii) one or more concepts coded in a software language natively used by AI engine and coded by the architect module in accordance with an embodiment. The example complex task may be composed of several concepts horizontally across its graph, such as Reaching, Moving, Grasping, and Stacking, that are independent of one another. The top level Grasp-n-Stack concept incorporates an integrator concept. The next level down concepts of the Grasping concept and the Stacking concept each incorporate an integrator concept. The graph vertically has levels. For example, the Grasp concept is made up of the concepts of Orient and Pinch. Likewise, the Stack concept is made up of the concepts of Orient the block and the Stack of blocks orientation.

In this example robotic control demonstration, the complex task of Grasp-n-Stack task was decomposed into a concept node network of nine concept nodes—1) reach for the object, 2) grasp the object, 3) orient the hand for grasping the object, 4) pinch the hand for grasping the object, 5) move the object, 6) stack the object, 7) orient the object for stacking, and 8) orient the stack of objects for stacking, which all make up the complex task. The 9) Grasp-n-Stack node may be an integrator node integrating the four top level concept nodes feeding into that node. The concepts of stack and grasp are each broken down into two lower level concepts each. The AI engine platform first trains the concept nodes in the AI model to learn the concept nodes of, for example, pinch, orient the hand of the robot, and orient the stack using reinforcement learning. The AI engine learns a meta-controller—or integrator—concept node in the AI model after the nodes feeding into that node are trained. The integrator node can combine these newly trained concept nodes with one or more pre-existing trained concept nodes, such as move and reach encoded in classical controllers, into a complete complex task of Grasp-n-Stacking contained in the resulting AI model. The AI engine's method of assembling the concept nodes can successfully solve the entire task, and could be, for example, 45× faster than DeepMind's approach for leveraging sub-tasks in a similar setting. (See Popov, I., Heess, N., Lillicrap, T., Hafner, R., Barth-Maron, G., Vecerik, M., Y., Erez, T., Riedmiller, M., 2017. Data-efficient deep reinforcement learning for dexterous manipulation. arXiv preprint arXiv:1704.03073.)

The modules of the AI engine decompose complex tasks into smaller, individual concepts. The complex task; and thus, the complex learning problem can be broken down into individual concepts, each concept learned independently, and then reassembled into a complete solution to the complex task. The modules of the AI engine can initially break an example overall task of Grasp-n-Stack down into four main concepts: 1) Reach the object, 2) Grasp the object, 3) Move, and 4) Stack the object in a stack. The main concept can have their own concepts feeding into them making the hierarchy at least two levels deep. In this example robotic control demonstration, the complex task was decomposed by the modules into a concept network of multiple concepts:—Reach for the object, Grasp the object, Move the object, Stack the object, and the integrated Grasp-n-Stack task. (See FIG. 1E for an example illustration) Each concept has its own corresponding AI object being trained as a concept node in the graph of nodes.

Figure 1C:
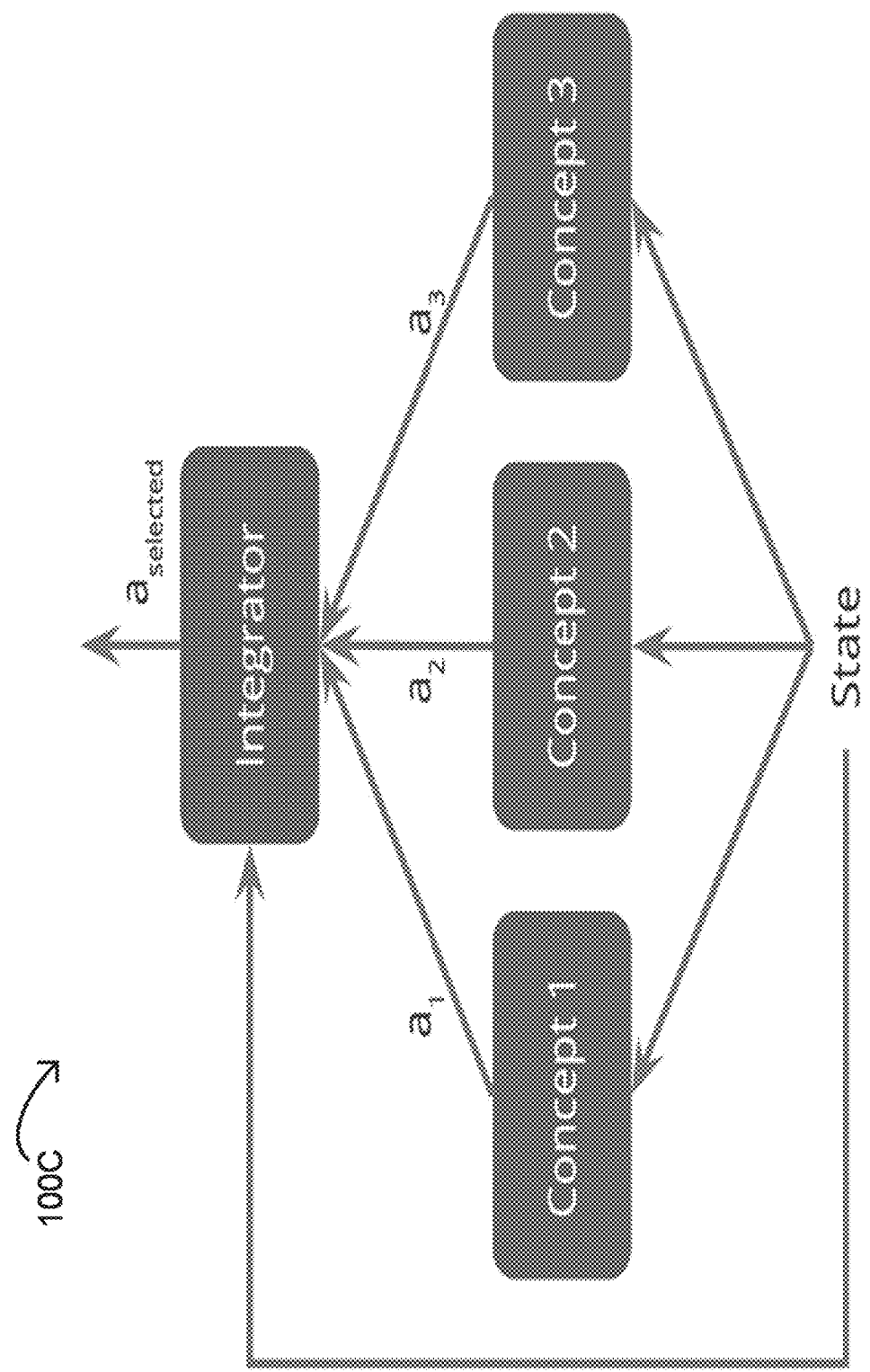
Figure 1D:
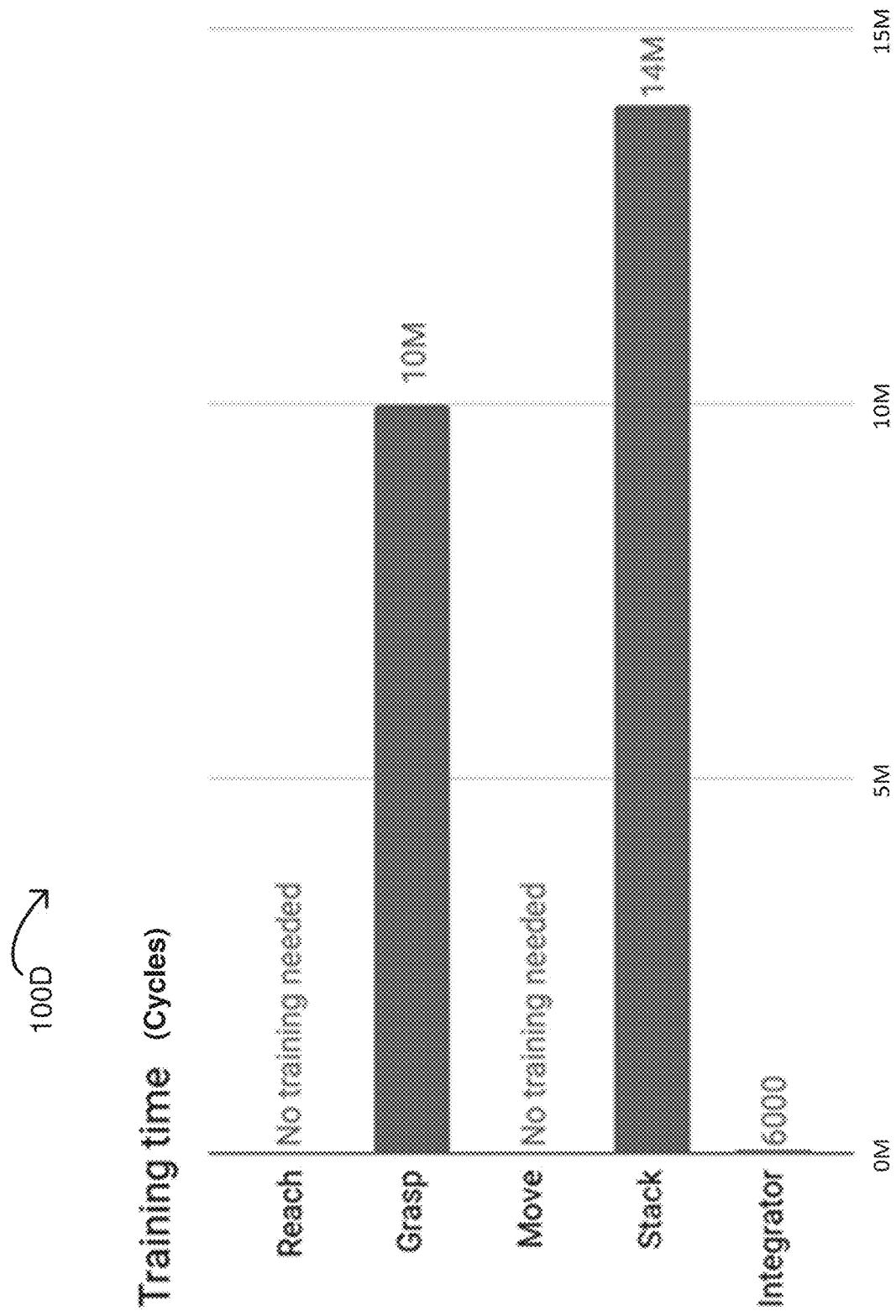
Figure 1E:
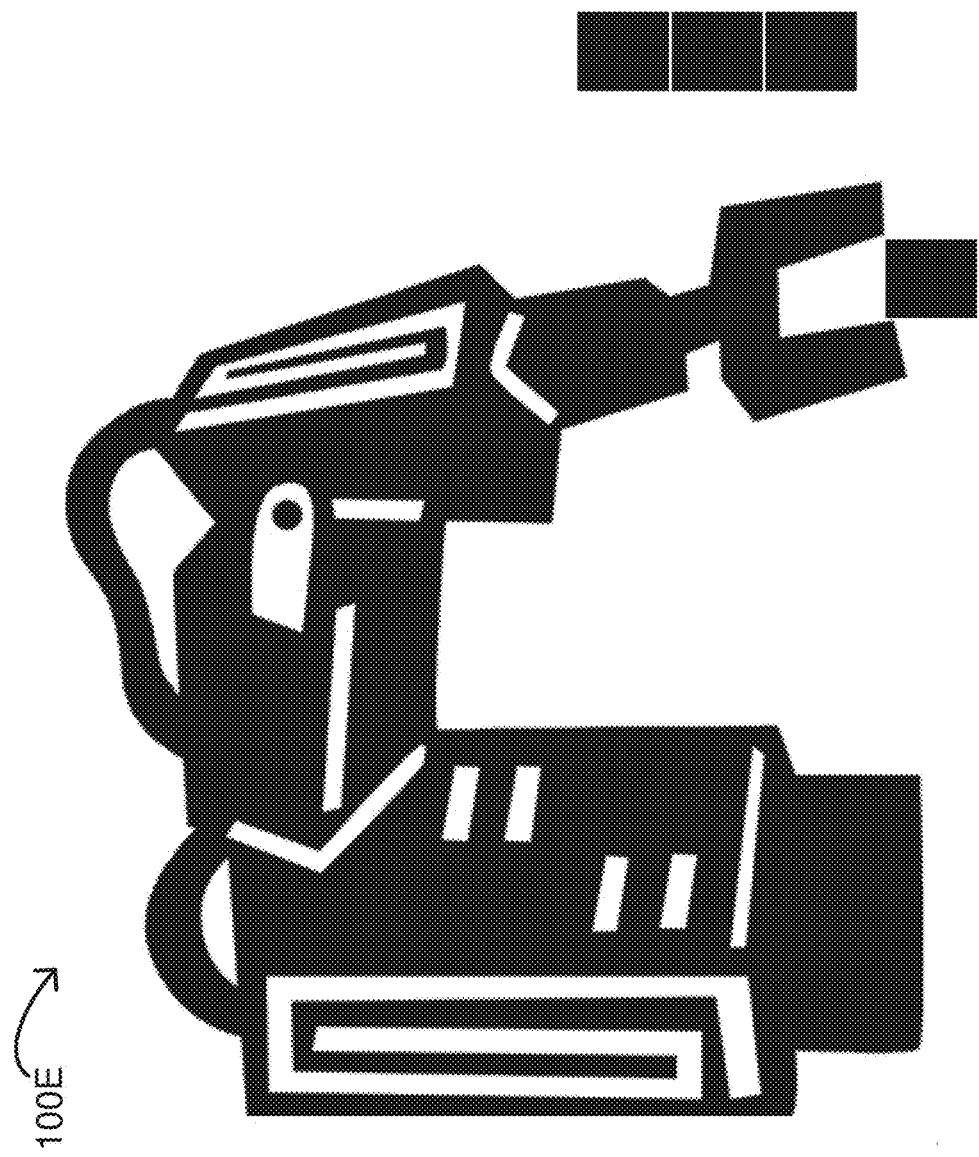

FIG. 1E illustrates a diagram of an embodiment of an example AI model being utilized by a robotic arm 100E to carry out individual concepts in the complex task. Stages of the complex task may include (a) Moving to the object, (b) Reaching for the object, (c) Grasping the object, and (d) Stacking the object on a stack of objects.

Referring back to FIGS. 1B and 1E, the example challenge is to Grasp a block and then Stack the block on top of another block. (See FIG. 1E.) The AI controlled robot must coordinate finger movement as well as differ its block positions and orientations. Dexterity is hard and flexibility to Grasp and Stack in different positions and orientations is a must. The solution is decomposition of the overall task into individual concepts. The AI engine first trained the AI model to learn the concepts of Grasp and Stack and their lower level concepts using reinforcement learning. These trainings of the different AI objects corresponding to their concepts can be done independently of each other. In addition, multiple simulations may be occurring at the same time for each concept in order to speed up the training on that specific concept. Once the Grasp and Stack concepts are trained, then all four AI concepts are then trained to learned to work with each other. The meta-controller—(e.g., integrator/selector concept)—then learns to combine the newly trained concepts with an existing Move classical controller (an external entity of code) and a Reach function (another external entity of code) into a complete Grasp-n-Stack complex task. The integrator quickly learns to select the correct AI concept for that task. The integrator can also very quickly learn, if need be, to slightly adjust the training of each AI concept to have them work together to achieve the main task. The AI engine's method of assembling the concepts successfully solves the entire complex task, and is, for example, multiple times faster than prior techniques in a similar setting.

Thus, an external entity of code, such as the Move concept in a classic controller or Reach concept from, for example, a python function, can be integrated by a learned integrator controller into the graph of nodes as a concept node that makes up the resulting AI model. Thus, the learned integrator controller is configured to combine a heterogeneous mix of concept nodes including i) one or more concept nodes derived from their description in the scripted file that need to be trained and are coded by the architect module, such as the Grasp or Stack concepts, with ii) one or more concept nodes of the external entities of code that include, for example, a classical controller or an already trained AI model, into a complete overall problem solution contained within the resulting AI model. As seen from FIG. 1B, the graph of nodes of the resulting AI model can be hierarchical and consists of nodes that are two or more layers deep.

Note, the scripted external block of code can be a pre-existing machine-learning model (which is being augmented, upgraded, or incorporated with the new blocks of code that are undergoing training). As discussed, an external entity of code may be i) an external AI model coded in different software language natively used by a resulting AI model, ii) an external function having some defined input and output that is coded in different software language natively used by a resulting AI model, iii) a block of code using a ReST API, iv) an already trained AI model coded in the software language natively used by the resulting AI model, and v) any combination of these. Thus, in an example, the external entities of code may be an already coded perception AI model or an already trained prediction AI model. The other concept nodes may be a new function or extended function for the already trained perception AI model or prediction AI model. The other concept nodes are to be trained by an instructor module in the AI engine with reinforcement learning technology to form different concept nodes in the resulting AI model.

The architect module can be configured to create a concept node for external entity of code by wrapping an external entity of code into a software container with an interface configured to exchange information in a protocol of a software language used by the external entity of code. Example IDL files, config files, and project files associated with the container will be later discussed in detail.

The architect module can be configured to create a number of nodes from a complete or partial specification (the latter implies that it will use some form of autoconcept generation) to learn a task or sub task.

Next, the description and functionality in the scripted file for the Grasp concept, which the architect module uses to create the AI object making up the Grasp concept, may be coded in a first software language, such as a pedagogical programming language. The architect module can be configured to parse scripted code in a pedagogical programming language in order to map the one or more concept nodes of the mental model onto one or more neural-network layers. The scripted block of code of the Move controller correlating to the external entity of code may be created in a second software language, such as a software simulation language including python and Tensor flow. The main idea here is that the AI engine is mapping the pedagogical programming language to an internal representation in another language. In an example, the second software language could be tensorflow via Python or a different framework, e.g., MXNET.

The architect module may put the concept node of Grasp and the concept node of Move in the same graph of nodes in the resulting AI model.

Note, once the resulting AI model is assembled by the architect module, the instructor model may then train the nodes needing training. The instructor module may be configured to analyze the scripted code in the pedagogical programming language in order to find a starting point among the one or more concept nodes and the corresponding one or more curriculums for the training. The instructor module may then train the AI model, the one or more trained machine-learning models, or the combination thereof in one or more training cycles with training data from one or more training-data sources selected from a simulator, a training-data generator, a training-data database, or a combination thereof based on training parameters in the pedagogical programming language. The instructor module can be configured to terminate neural-network training upon an instructor module-determined terminating condition.

Parallel training of concepts can be employed. In parallel to the training of the Stack concept, the instructor module and learner module may cooperate to train the AI object corresponding to the Grasp concept. The instructor module and learner module may cooperate to put in the algorithms and curriculum for the Grasp training. Initially, the AI controlled robot is expected to flail and fail. However, over time, the AI controlled robot learns what to do based on the reward the AI engine gives the AI controlled robot (for success).

Likewise, in parallel to the training of the Grasp concept, the instructor module and learner module may cooperate to train the AI object corresponding to the Stack concept. The instructor module and learner module may cooperate to put in the algorithms and curriculum for the Stack AI concept to train on.

Note, for designing reward functions within the Grasp and Stack concepts, a concept of orienting the hand for Grasping and/or Stacking the object can be learned. Thus, referring to FIG. 1B, to further simplify the learning problem and corresponding reward functions, the modules further break the top level concept of Grasp into a lower level of two concepts of: Orienting the hand around object in preparation for Grasping, and Pinching the object, etc. Likewise, the modules further break the top level concept of Stacking into a lower level of two concepts: Orienting the hand around object in preparation for stacking, and Orienting the stack, for a simpler reward functions.

Using hierarchical decomposition with deep reinforcement learning, the AI engine platform achieves for example, a robotics control benchmark, with an order of magnitude fewer training cycles. Thus, an enterprise could use hierarchical decomposition process of breaking down the overall task into multiple smaller tasks being trained in parallel rather than using a single end-to-end algorithm. Once each AI object corresponding to a given concept is trained on its corresponding individual task, then all of the trained AI objects can be trained to work with each other to achieve the overall task. This process trains multiple AI concepts in parallel and then combines the trained versions of the concepts to achieve a similar desired result to the one end-to-end algorithm but in a faster amount of time and possibly with better accuracy. For example, a simulated robot or CNC machine may successfully train upon the individual concepts of i) Grasping a block and ii) Stacking the block on top of one another, in parallel to each other and apply deep reinforcement learning algorithms to learn these concepts. Training a system using multiple concepts, for example, the concepts of Reach, Grasp, and Stack, can be trained on individually and in parallel to each other, which requires far less training time and computing cycles. Next, those trained concepts can be trained to work with each other to accomplish the end result of what the single end-to-end algorithm would typically accomplish.

For FIG. 1B, each learned actor concept has its own reward function, independent of the overall problem. In an embodiment, FIG. 1B shows three integrator nodes (which need training to integrate all of the concepts), three control concepts (which need training to learn that concept), and three classical controllers (which are imported external entities of code). The Grasp-n-Stack AI object, the Grasp AI object, and the Stack AI object, each incorporates an integrator node. Both Orient the hand concepts are learned concepts as well as the Orient the stack of blocks concept. The Reach, Move and Pinch concepts may be implemented as classical controllers. Each node also implicitly takes the state as input, and can be paired with input and output transformations. Each of these has its own reward function.

Next, there are copious potential uses for a heterogeneous mix of concept nodes including one or more concept nodes derived from the description in the scripted file that need to be trained and are coded by the architect module, with one or more concepts nodes of the external entity of code that include, for example, a classical controller, an already trained AI model, etc. into a complete overall problem solution contained within a same resulting AI model.

Users can perform transformations on data passing between different concept nodes within the concept node graph, easing reuse of previously-trained AI models, or iterating with different data representations.

Users can embed their own software and logic for producing data within the AI engine creation framework via use of its modules. This can be used to perform domain-specific functions that don't specifically need to be learned, opening up many possibilities for user-customization of the data-flow pipeline.

Users can connect and call remote services within the AI engine's learning framework via use of its modules, such as calling out to a network resource for data or processing. This further enhances the flexibility of a heterogeneous mix of concept nodes including one or more external entities of code by allowing remote resource access during training of an AI model.

Users can embed their own previously-built learning models directly into the concept node graph in the resulting AI model generated by the AI engine. This allows users to build newer and more complex models without throwing away their existing work, and instead can be executed directly in the training of a higher-level AI model.

The AI engine may use a series of files to accomplish these functions. In an embodiment, the Interface Description Language (IDL) file, the project file, and the config file have different responsibilities. It is not always required that the Interface Definition Language file, the project file, and the config file be separate files.

The project file is the root and maps resources (e.g. files) for the concept of that external entity of code. Note that the project file for the AI model is doing the importing. The projects for the resulting AI model use project files for compilation resolution of references (among other things). The project file describes the extensions to the external entity of code. Note, some external entity of code may not need project files.

Next, AI models coded in the native software of the AI engine that are already compiled and that have already been trained, well these can be considered an external entity of code because they are plugged into the graph with little else needed from the AI engine.

Next, Tensorflow models and python functions may also be compiled through an external system to the AI engine.

The project file contains file paths for the native code of the AI engine and python, as well as a list of training sources. Each type has associated fields. For a hosted simulator, the project file contains the simulator declaration—that is currently not required for a local simulator. The project file may also contain i) Schema references for the predefined (keyword) schemas input, output, config, and state, and ii) custom schema declarations.

The Interface Description Language (IDL) file maps the external entity of code into the AI engine's system and the data flow graph of the resulting AI model. The IDL file may reside with the external entity of code.

IDL Syntax

Schemas in the IDL may have range expressions. These are complex enough to require parsing and error reporting. The IDL file will use the schema grammar as currently defined and add a rule for the interface declaration. The IDL file may be a set of schema references: input, output (required), config, state, inside of an interface declaration. The backend (ast.py) will read in the interface declaration and create a dictionary for the external entity of code.

Thus, the AI engine may use a first file, such as an Interface Definition Language file, to map the interface of the software container between an external entity of code and the corresponding API for the AI engine. The first file maps the external entity of code and its data flow into the graph of nodes making up the resulting AI model.

Note, a compiler in the one or more memories of the AI engine is configured to generate an assembly code from a source code written in the pedagogical programming language when the compiler is executed by the one or more processors. The compiler may be further configured to match-check schemas and report one or more errors if the schemas expected to match do not match.

The compiler may process, for example, a Tensorflow config file and turn the model into a 'blob' which is a snapshot of the model at the time of compile. The backend will use this snapshot.

The next file is the config file. The config file handles deployment. The config file describes deployment and configuration of the external entity of code. The dataflow graph graphs concept nodes including a containerized external entity of code. The config file may have the following characteristics:

May be a Json
The config file lives with the external entity of code.
Generally authored by the creator of the external entity of code (or whomever selected the external entity of code for reuse).
Supports deployment, instantiation, location of entity.
hasPermanentState. Boolean. state.
hasSessionState. Boolean. State.
isIdempotent. Boolean. Serial invocations return same result.

The config file (a Json file) will be extensible to the deployment information requirements of the different IFE's that the AI engine support.

External entities of code are generally packaged in a container with a config file and a project file. These files contain what the compiler, backend, and AI engine need to know to reuse the external entity of code within the context used by the AI engine. This approach supports the design principle of separation of concerns and in practical terms supports usage of heterogeneous components.

The AI engine may import external files. These are the steps of import, with a compiler emphasis.

The compiler gets the URI for the imported entity from the project file. The uri can resolve to a remote config file or to a local file (python or inkling). A two step process to resolve the name in the import statement. For a local python function import, the URI is the path to the pair of files: my_func.py and my_func.idl.

If the local python import has non-default configuration, that config can appear in the project file, or in its own config file. For a local file, this is the path to the inkling file. For remote entities, this is the URI to the config file on the remote host.

For models, the compiler will check that the version requested in the project file exists on the host. The compiler must parse the IDLs for all external entities of code. The compiler synthesizes an 'imported_entity' AST node for each external entity of code. This node will be type checked and integrated into the concept node stream graph (with input and output schemas).

The Gears design allows the AI engine's architecture to enable use of external models and functions embedded within the AI engine's learning environment. External entities of code are specified directly addressed and accommodated within the native code used by the AI engine, and provide an interface to make use of arbitrary user models, data and software. This unlocks a large amount of flexibility for Inkling users to insert transformations between concept nodes, connect pre-existing trained models to a AI model or any other data-driven services as needed.

Note, the resultant AI model is configured, after its initial training of all of the individual concept nodes making up the AI model, to allow individual concept nodes to be replaced without having to retraining other concepts in the graph of concept nodes making up the resulting AI model; and thus, an older version of a first concept node can be replaced with a new version of the first concept node without having to retrain any of the other concepts in the graph of concept nodes making up the resulting AI model. Each concept is trained individually so that concept can be replaced without affecting the training of the other concepts.

For example, the AI model creator can switch between single-layer concept node of Grasp and over to a decomposed Grasp node with two sub concepts of Orient and Pinch and conduct experiments, and could adapt to different versions of the grasp concept without having to change the reach, move, or overall integrator concept nodes. Also, this allows existing solutions to sub-problems to be composed into an overall solution without requiring re-training, regardless of the algorithms and state space definitions used to solve each sub-problem.

Each discrete concept node making up a machine-learning model can be encoded or containerized into its own new concept node and that set of concept nodes is put into a graph of concept nodes intermixed with concept nodes that are new, pre-existing classical controller or previously trained AI models, and together extend the functionality of the initial machine-learning model.

Next, the AI engine is configured to have one or more schema relationships including dataflow operations stored in a database with their interfaces to interact with the external entities of code and corresponding management modules to automate the dataflow; and thus, a software coding for the AI engine, such as Inkling, is extended to support describing the interfaces and relationships between external entities of code and the other scripted concept nodes contained within the resulting AI model. This includes validating the dataflow and enforcing interfaces between the user-supplied functions and the AI engine platform as a compilation step.

The AI engine is configured to have one or more schema relationships and interfaces scripted to interact with external blocks of code foreign to the AI engine and an already trained AI model coded in the native language used by the AI engine. For example: The AI engine can be configured to have one or more schema relationships including dataflow operations, and interfaces to interact with a
 a python function
 a trained AI model coded in the native language used by the AI engine
 a Tensorflow model (this means that the model was saved and will be served by Tensorflow serving)
 a non-Tensorflow, non-natively trained AI model
 calling out to a cluster. (This can be supported through Python and as a native software function.)
 ReST API—Representational State Transfer Application Programming Interface. ReST relies on a stateless, client-server, cacheable communications protocol. ReSTful implementations make use of standards, such as HTTP, URI, JSON, and XML, which simply follow the ReST an architectural style.

An external entity of code can have these essential characteristics:
 1. An external entity of code is not a simple source import.
 2. At compile time, program files coded in the native language used by the AI engine are incorporated by the compiler into the concept node stream graph of the resulting AI model.
 3. At compile time, external entity of code can be containerized by the architect module.
  a. An external entity of code can have configuration and state.
   i. This configuration and state does not need to be incorporated into the concept node stream graph.
 4. At runtime an external entity of code may be treated as a data flow graph. An external entity of code can be as simple as a single node but conceptually it is a concept in the graph. Like all our graphs, this means the external entity of code can have a single input, single output.
 (Note that input in this context can be the union of outputs from multiple concept nodes.)
  a. This means that the external entity of code can be a node in the concept node stream graph as displayed in a user interface such as Mastermind.

A user of the AI engine using the external entities of code's functionality will benefit from: 1) compatibility with popular machine-learning frameworks including TensorFlow, Torch, CNTK, scikit learn, and OpenCV; 2) ease of integration of Python libraries and custom code into the AI engine's runtime environment; 3) simplified AI model development and collaboration across teams; 4) a single AI engine platform to develop, deploy, and manage all AI models; 5) combining existing perception and prediction models with state-of-the art reinforcement learning technology; and other similar benefits discussed herein.

FIG. 1C illustrates a block diagram of an embodiment of a complex main task and its graph of i) a concept node corresponding to an integrator concept, and ii) two or more levels of concepts corresponding to the individual concepts that hierarchically stem forth from the integrator concept in the graph of the AI model.

The external entities of code can be integrated by a learned integrator controller into the graph of nodes 100C as concept nodes. The learned integrator controller can combine inputs from a heterogeneous mix of concept nodes including i) concept nodes derived from a description in the scripted file that needs to be trained and are coded by the architect module, with ii) concepts corresponding to the external entities of code into a complete overall problem solution contained within the resulting AI model.

The concept node of the integrator concept can be trained via reinforcement learning to learn to choose from the two or more AI concepts in the levels stemming from the integrator node in the graph by choosing a particular concept that is considered most applicable based on a current state data. This is a discrete reinforcement learning problem, that the AI engine solves with an example learning algorithm, such as the DQN algorithm, using overall task success as the reward. (Note, any discrete reinforcement learning algorithm could be used.) To make this effective, the AI engine may not choose a new concept at each time step but rather train a specific concept until it reaches a termination condition. The integrator may use concepts with a long-running termination condition: each concept can have pre-conditions for when it can be selected, and a run-until condition to meet before switching to another individual concept. This gives the designer an easy way to specify constraints like "don't try to Grasp until you're close to the object", and "once you start to move, continue that for at least 100 time steps".

FIG. 1D illustrates a block diagram of an embodiment of a graph of the training of two or more different concepts in the complex task, in parallel, as well as re-use of the external entities of code in order to lessen the training cycles in accordance with an embodiment.

The graph 100D of the training of two or more different sub concepts corresponding to the individual concepts in the complex task, in parallel, shows that the parallel training and simpler reward functions speed up an overall training duration for the complex task on the one or more computing platforms.

Also, the re-use of the external entities of code as a concept node in the graph making up the resulting AI model allows a creation and training of the resulting AI model with less computing cycles and power consumption in the AI engine than creating and training all of the concept nodes in the resulting AI model from scratch. From scratch is defined to convey from a point where nothing has been done, so that the modules in the AI engine would have to do creating and training of a block of code corresponding to the concept node from the beginning.

Concepts can be broken down into smaller individual concepts and then training occurs specifically for a concept starting at its lowest level of decomposition (i.e., the leaf in a tree structure). For example, looking at the graph 1D and FIG. 1A, the "Grasp the object" concept and the "Stack the object" concepts are simple tasks for which the AI system uses deep reinforcement learning. The AI engine trains the Grasp concept and Stack concept with reinforcement learning, using, for example, a TRPO algorithm. Also, the "reach toward the object to pick up" and "move toward target block" concepts are simple motions for which the resulting AI model uses a classical motion controller. The AI engine allows one to integrate such controllers through the containerizing functionality.

Training the Stack concept, for example, took <14 million simulator training cycles>, which is equivalent to <139 hours> of simulated robot time. The Grasp concept was, for example, slightly <faster>, taking <125 hours> of simulated robot time. The motion steps did not require any training, and the integrator trains very quickly—orders of magnitude faster than the guided-retraining approach used in an example prior art technique.

Each concept can have different state+action spaces. Typically, these state+action spaces can be smaller than a globally-applicable state/action space, which makes the problem easier and learning faster. Since the concepts are much simpler, their goals can be defined on subsets of state space, significantly constraining the necessary exploration and leading to data-efficient learning even in complex environments. The AI engine can mix neural and classical controllers in the same task. The AI engine can enable hierarchical decomposition—a single concept can itself be an integrator choosing among subcomponents. The AI engine can use this to split Grasp-n-Stack concept into four sub concepts of i) Grasp, ii) Stack, iii) Reach, and iv) Move. Each of these concepts, such as the Grasp and Stack concepts, can be trained in parallel.

Multiple Managed Simulations Occurring at the Same Time to Decrease an Overall Training Time Multiple managed simulations occurring at the same time to train multiple AI concepts, improves the system's capability to extract and optimize knowledge faster from large and complex simulations and data, makes users using the system more productive, and decreases the duration of training to accomplish a complex task. Each concept, such as Grasp, may be trained in a parallel with another concept. In addition, already trained concepts, such as Reach, may be incorporated into the AI model. In addition, multiple versions of a particular concept may be trained in parallel with each other.

The AI System

FIG. 1A provides a schematic illustrating building, training, and deploying a trained AI model in accordance with an embodiment.

As shown, AI systems and methods provided herein enable users such as software developers to design an AI model, build the AI model, train the AI model to provide a trained AI model, and deploy the trained AI model as a deployed AI model in any of a number of desired ways. For example, AI systems and methods provided herein enable users such as software developers to design a neural network layout or neural network topology 102, build a neural network 104, train the neural network 104 to provide a trained neural network 106, and deploy the trained neural network 106 as a deployed neural network 108 in any of a number of desired ways. For example, the trained AI model or the trained neural network 106 can be deployed in or used with a software application or a hardware-based system.

FIG. 2A provides a schematic illustrating an AI engine having multiple independent modules on one or more computing platforms, where the architect module is configured to create one or more concept nodes by wrapping each external entity of code into a software container with an interface configured to exchange information in a protocol of a software language used by that external entity of code in accordance with an embodiment.

As shown, the AI system 200 includes one or more client systems 210 and one or more server systems 220, wherein each server system or any two or more servers systems of the one or more server systems 220 can be referred to herein as an AI engine. The one or more client systems 210 can be client systems and include a coder 212 or coding means for generating programming code such as programming code in a pedagogical programming language (e.g., Inkling™). The one or more client systems 210 can further include a training data source 214. While not shown in FIG. 2A, the training data source 214 can alternatively be included in the one or more server systems 220, or the training data source 214 can be include in both the one or more client systems 210 and the one or more server systems 220. The one or more server systems 220 can be server systems and include a compiler 222 for the programming code and an AI generator 223 for generating the trained neural network 106 via one or more training cycles in the AI generator 223.

While the AI system 200 of FIG. 2A is shown including the one or more client systems 210 and the one or more server systems 220, it should be understood that the one or more client systems 210 and the one or more server systems 220 need not be deployed exactly as shown or with local and remote systems telecommunicatively coupled over substantially large geographic distances. The one or more client systems 210, the one or more server systems 220, or one or more components thereof can be deployed at a single geographic location such as in a building or room of the building. Moreover, the one or more client systems 210 and the one or more server systems 220 can be deployed in a single system such as a powerful, single-enclosure machine. As used herein, the foregoing refers to so-called on-premises installations, which is another operating environment for building AI, training AI, deploying AI, or a combination thereof.

FIG. 2B provides a schematic illustrating a method 201 associated with an AI system in accordance with an embodiment.

As shown in view of FIG. 2A, a client such as a client of the one or more clients 210 can send programming code from the coder 212 or an intermediate agent to the compiler 222 on a server such as a server of the one or more server systems 220 for compiling the programming code into an optimized assembly code for the AI generator 223. The compiler 222 can send the compiled code or assembly code to the AI generator 223, which proposes and builds a neural network such as the neural network 104 for training as determined by features of the code. The AI generator can request training data from the training data source 214, and the training data source 214 can send the training data to the AI generator 223 upon the request. The AI generator 223 can subsequently train the neural network 104 on the training data in one or more training cycles to provide a trained state of the neural network or the trained neural network 106. The AI generator 223 can elicit a prediction from the trained neural network 106 and send the prediction to the training data source 214 for updated training data based upon the prediction and, optionally, additional training cycles. When the one or more training cycles are complete, the AI generator 223 can save the trained state of the neural network as the trained neural network 106.

FIG. 3A provides a block diagram illustrating an AI engine using one or more modules to create concept nodes in the graph of nodes, where the concept is derived from its description in a scripted file and coded by the architect module in accordance with an embodiment.

Following on the AI system 200 of FIG. 2A, the AI generator 223 for generating the trained neural network 106 can include one or more AI-generator modules selected from at least an instructor module 324, an architect module 326, and a learner module 328 as shown. The instructor module 324, the architect module 326, and the learner module 328 can respectively be referred to herein as the Instructor, the Architect, and the Learner. The instructor module 324 can optionally include hyperlearner module 325, which can be referred to herein as the hyperlearner, and which can be configured to select one or more hyperparameters for any one or more of a neural network configuration, a learning algorithm, a learning optimizer, and the like. Before selecting the one or more hyperparameters, the hyperlearner module 325 can access a database of solution statistics gathered from one or more repositories of previous problems and previously built AI models therefor and take a fingerprint of a sample of available data by using random predictions. The hyperlearner module 325 can optionally be contained in a different AI-generator module such as the architect module 326 or the learner module 328, or the hyperlearner module 325 can be an AI-generator module itself. The learner module 328 can optionally include a predictor module 329, which can be referred to herein as the Predictor, and which can provide one or more predictions for a trained neural network such as the trained neural network 106 hosted in a prediction mode. The predictor module 329 can optionally be contained in a different AI-generator module such as the instructor module 324 or the architect module 326, or the predictor module 329 can be an AI-generator module itself. The AI generator 223 including the foregoing one or more AI-generator modules can be configured to generate the trained neural network 106 from compiled code via one or more training cycles in the AI generator 223.

Like the AI system 200 of FIG. 2A, the AI system 300 of FIG. 3A is shown including the one or more client systems 210 and the one or more server systems 220, it should be understood that the one or more client systems 210 and the one or more server systems 220 need not be deployed exactly as shown or with local and remote systems telecommunicatively coupled over substantially large geographic distances. The one or more client systems 210, the one or more server systems 220, or one or more components thereof can be deployed at a single geographic location such as in a building or room of the building. Moreover, the one or more client systems 210 and the one or more server systems 220 can be deployed in a single system such as a powerful, single-enclosure machine. Again, the foregoing refers to so-called on-premises installations, which is another operating environment for building AI, training AI, deploying AI, or a combination thereof.

Each independent process, such as 1) the instructor module, 2) the learner module, and 3) the architect module as part of an AI-model service can be configured to be able to operate on either of a CPU computing device or a GPU computing device or both.

In an embodiment, other independent processes cooperate together and contain functionality from the instructor module, the learner module, etc. For example, a scholar process is coded to handle both the training for a given concept (lesson management) and training a lesson. The scholar process trains a given concept (e.g. does the job of instructor and learner in an alternative architecture). When the AI engine trains the same concept or multiple different concepts in parallel then the AI engine will have multiple scholars running in parallel. A director module manages the training of a concept graph. A conductor process merely manages resource allocation required for training an AI model. The director module determines how the resources are used to train the graph of nodes in parallel. Each concept is trained by a scholar process and in the case of multiple concepts being trained in parallel multiple scholar processes are run simultaneously. This is all managed by the director module.

FIG. 3B provides a schematic illustrating a method associated with an AI system in accordance with an embodiment.

As shown in view of FIG. 3A, a client such as a client of the one or more clients 210 can send programming code from the coder 212 or an intermediate agent to the compiler 222 on a server such as server of the one or more server systems 220 for compiling the programming code into an optimized assembly code. The compiler 222 can send the compiled code or assembly code to the instructor module 324, which, in turn, can send the code to the architect module 326. The architect module 326 can propose a neural network layout such as the neural network layout 102—as well as optimize the neural network layout 102—for building and training as determined by features of the code, and the architect module 326 can send the neural network layout 102 to the instructor module 324. In addition, the architect module 326 can map between one or more concepts or concept nodes of a mental model (e.g., an Inkling™-based mental model) and one or more layers of the neural network layout 102 and subsequently send one or more maps to the learner module 328. The learner module 328 can build a neural network such as the neural network 104 from the neural network layout 102 specified by the architect module 326. The instructor module 324 can find a starting point among the one or more concept nodes in the mental model and one or more curriculums (e.g., Inkling™-based curriculums) for training the neural network 104. The instructor module 324 can also request training data from the training data source 214 or any additional training data sources, and the training data source 214 (or sources) can send the training data to the instructor module 324 upon the request. The instructor module 324 can subsequently instruct the learner module 328 on training the neural network 104 (e.g., which lessons should be taught in which order) with the one or more curriculums for training the one or more concepts in the mental mode using the training data and one or more hyperparameters from the hyperlearner module 325. Training the neural network 104 can take place in one or more training cycles with the training data to yield a trained state of the neural network or the trained neural network 106. The instructor module 324 can decide what concepts and streams (e.g., Inkling™-based concepts and streams) should be actively trained in a mental model, as well as terminating conditions for training the concepts. The learner module 328 or the predictor module 329 can elicit a prediction from the trained neural network 106 and send the prediction to the instructor module 324. The instructor module 324, in turn, can send the prediction to the training data source 214 for updated training data based upon the prediction and, optionally, instruct the learner module 328 in additional training cycles. When the one or more training cycles are complete, the learner module 328 can save the trained state of the neural network as the trained neural network 106.

Pedagogical Programming

Pedagogical programming focuses on codifying one or more of the following: 1) What are the concepts associated with a problem domain? 2) How do the concepts relate to each other? 3) How does one go about teaching the concepts?

The pedagogical programming language Inkling™ is a special purpose programming language designed to effect a trained AI model using higher-level mental models and concepts to be learned instead of lower-level mechanics for building and teaching (or training) neural networks. Inkling™ is a declarative, strongly typed pedagogical programming language configured to generalize from vast, dynamic AI algorithms that generally require high levels of expertise in machine learning. Source code authored with Inkling™ or the Inkling™ file can contain the higher-level mental models and concepts to be taught to and, thereby, learned by an AI model. The Inkling™ file can also contain curricula and lessons thereof to teach the concepts to be learned by the AI model.

Mental Models and Concepts

FIGS. 4A and 4B provide schematics respectively illustrating mental models 400A and 400B and concepts thereof in accordance with an embodiment.

Beginning with concepts, a concept in Inkling™ can be a software object and/or define something that an AI model or a neural network can be trained on and learn. Once learned, the AI model can provide intelligent output. Every Inkling™ file or program needs at least one concept.

A concept can fall into one of at least two groups: fact and strategy. A fact-type concept can describe a state of one or more things such as an object, a ball, a character, an enemy, a light, a person, or the like. The state can be whether the one or more things are on or off, hot or cold, a number or a letter, or the like. The fact-type concept can also describe a location. A strategy-type concept can reflect a method or a behavior such as "avoid_ghosts," "keep_the_paddle_under_the_ball," "don't_run_into_walls," "turn_lights_off," "get_high_score," or the like. Both FIGS. 4A and 4B show mental models including the strategy-type concept "get high score."

Turning to mental models, a mental model in Inkling™ is also something that an AI model can be trained on and learn. A mental model can include an input, one or more concepts or concept nodes, one or more data transformation streams or stream nodes, and an output, all of which can be structured (e.g., hierarchically, cyclically, etc.) in terms of the one or more concepts and the one or more data transformation streams or stream nodes. A mental model models a problem domain through codification of underlying concepts and their relationships to one another, often starting from relatively simple concepts and building in more complex concepts as needed.

As shown in FIG. 4A, a relatively simple, single-concept mental model can include, for example, a strategy-type concept such as "get_high_score." The single-concept mental model and the concept thereof can be expressed in Inkling™ as in the following Inkling™ code block, wherein the concept is "get_high_score," a prediction type for the concept is "classifier," the concept follows input of the game state to the neural network, and the concept feeds output from the neural network:

```
concept get_high_score : (PlayerMove)
    is classifier
    follows input(GameState)
    feeds output
end
```

"PlayerMove" and "GameState" represent schema references, which, in turn, describe one or more data types. Schemas are described in further detail herein.

As shown in FIG. 4B, a more complex, multi-concept mental model can include a hierarchical structure including, for example, strategy-type concepts such as "keep_paddle_under_ball," "get_high_score," and state-type concepts such as "ball_location." The multi-concept mental model and the concepts thereof can be expressed in Inkling™ as in the following code block, wherein the concepts are "ball_location," "keep_paddle_under_ball," and "get_high_score."

```
concept ball_location : (Int32 x, Int32 y)
    is estimator
    follows input(GameState)
end
concept keep_paddle_under_ball : (PlayerMove)
    is classifier
    follows ball_location, input(GameState)
end
concept get_high_score : (PlayerMove)
    is classifier
    follows keep_paddle_under_ball, input(GameState)
    feeds output
end
```

Prediction types for the concepts are "estimator" and "classifier," wherein an estimator is configured to estimate a value from its input, and wherein a classifier is configured to classify from its input. Other prediction types for the concepts can also include, but are not limited to, "predictor" and "goal."

As further shown in FIG. 4B, a concept in a multi-concept mental model can receive input from other concepts in the mental model, send output to other concepts in the mental model, provide a final output or result output, or a combination thereof. This can be expressed in Inkling™ as in the foregoing code block. For example, the concept "keep_paddle_under_ball" follows the concept "ball_location" and input of the game state to the neural network, and the concept "get_high_score" follows the concept "keep_paddle_under_ball" and the input of the game state to the neural network. In addition, the concept "get_high_score" feeds output from the neural network. Graphically, the foregoing code block yields the hierarchical, multi-concept mental model of FIG. 4B. Addition of more concepts to a mental model can decrease training time for an AI model, as well as enable a trained AI model to give smarter, more accurate predictions from training or testing data fed to the mental model.

The input of a mental model can be data representative of the problem domain such as images of cats and dogs for differentiating between cats and dogs. The output of the mental model can be a solution of the problem domain such as "yes" the first image is of a cat or "no" the first image is not of a cat.

In view of the foregoing, the pedagogical programming language Inkling™ can be configured to enable an author to define each of the one or more concept nodes in a mental model by name; prediction type such as estimator, classifier, predictor, and goal; input; output; and one or more connecting concept nodes in the mental model including leading, input-providing concept nodes and following, output-accepting concept nodes, for example, using the keywords "follows" and "feeds."

Next, AI engine's internal learning systems properly execute and use the user-provided systems and data during the course of training. During actual training, dataflow from the simulator will follow the dependencies laid out by the user in the description file. The external entities of codes located as leaf nodes in the concept node graph can operate directly on input streams from simulators. If not a leaf node, the external entities of codes will be supplied with data from their incoming concept node dependencies (other external entities of codes or model outputs) following the AI engine's schema rules.

Streams

In addition to one or more concepts, a mental model can further include one or more data transformation streams or stream nodes among the structured one or more concepts. Data can flow into a stream node, be processed, and subsequently sent to other nodes (e.g., concept nodes, stream nodes, or both) in the neural network or output from the neural network.

A stream keyword declares a functional transformation of data. Any valid Language INtegrated Query ("LINQ") statement can be declared, and, as such, a stream node can operate directly on input data, data from other stream nodes, data from concept nodes, from literals, and from built in functions (for example to return random data or sequence data). For example, the following Inkling™ code block declares a functional transformation of data that is explicitly specified:

```
Stream Double
from
  item in input(Int32 x)
select
  item.x*2
=>
output(Int32 y)
```

The foregoing Inkling™ code block declares a stream node "Double" that reads a 32-bit signed integer from external input to the neural network, doubles it, and directs the result to any subscribed listeners. The "from" and "=>" (or "into") clauses are similar to "follows" and "feeds" used for the foregoing one or more concepts, which specify construction of the mental model including the one or more concepts and any streams. The select clause can perform a data transformation, including any functions exposed via one or more system libraries (e.g., computer vision algorithms).

Curricula and Lessons

Pedagogical programming expresses in scripted code the solution to a problem in terms of how you teach the AI engine to find the solution as opposed to how to calculate the solution. Pedagogical programming focuses on:

What do you want the AI engine to know? Pedagogical programming captures the concepts and their relationship to each other and forms a directed graph of the concepts.

Imagine learning to play baseball; there are a lot of concepts involved. It goes beyond just the rules of the game, and includes things like batting stance, bat grip, eye hand coordination, etc.

How do you go about teaching those things?

Pedagogical programming focuses on how the problem can be taught, not how it can be calculated.

Imagine teaching a child to play baseball. You can't just explain the whole game to them and expect them to understand how to play. You'd break down learning into pieces, and create a series of lessons that would help them learn how to play baseball.

Let's say, to start, you wanted to teach them the concept of hand eye coordination. There would, likely, be a sequence of lessons to do this. You might start with a whiffle ball on a tee, progress to a tee that pops the ball up, move to underhand pitches, and then overhand pitches. You could continue to build upon your hand eye coordination concept with things like curved pitches, different styles of catching, and other exercises. It's all teaching one concept—eye hand coordination—but using progressive lessons to do so.

A curriculum is used to teach a concept to a neural network, and there is at least a 1-way relationship between the curriculum and the concept to be taught. For example, for every specified concept, a curriculum is to be specified to teach the concept. Training data is to be provided to train the neural network on the concept, and the AI engine is to be told whether its understanding of the concept, once taught, is correct or not. A curriculum is analogous to a teacher assigning readings to a student from a book and subsequently testing the student on the readings of the book or the book itself. The ways in which the training data is presented is broken into individual components termed "lessons." In the book analogy, the book can be the curriculum and the lessons can be individual chapters in the book. Lessons allow the concept to learn bit-by-bit, rather than all at once.

A curriculum definition declares a set of one or more lessons that can be utilized to teach a concept, each of which lessons can be configured to optionally use a different flow of training data. The curriculum definition specifies which concept this curriculum trains, which simulation should be used with this curriculum, and the objective function used to evaluate the learning system's performance. For example, the following Inkling™ code block declares a curriculum for training the foregoing "get_high_score" concept:

```
curriculum get_high_score_curriculum
  train get_high_score
  with simulator breakout_simulator(BreakoutConfig):(GameState)
  objective score
  # get_high_score lesson(s) specified here
  end
```

In the foregoing Inkling™ code block, the keyword "curriculum" names the curriculum (e.g., "get_high_score_curriculum") and declares a set of lessons (see "# get_high_score lesson(s) specified here" comment) used to teach a concept. The keyword "train" indicates the concept by name (e.g., "get_high_score") that the curriculum is to train; the keyword "with" specifies a subsequent training data-source type (e.g., a simulator, a training-data generator, a training-data database) that should be used with the curriculum followed by the training data-source name (e.g., "breakout_simulator"); and the keyword "objective" specifies an objective function or goal (e.g., score) used to evaluate the neural network's performance and, thus, a termination condition for the concept node to be trained. As such, the "get_high_score_curriculum" trains the concept "get_high_score" using a Breakout simulator named "breakout_simulator," which simulator can be written in any language (e.g., python). The objective of "get_high_score_curriculum" is to increase the score as much as possible.

In another example, the following Inkling™ code block declares a curriculum for training the foregoing "ball_location" concept:

```
curriculum ball_location_curriculum
    train ball_location
    with simulator breakout_simulator(BreakoutConfig):(GameState)
    objective ball_location_distance
# ball_location lesson(s) specified here
end
```

In the foregoing Inkling™ code block, the keyword "curriculum" names the curriculum (e.g., "ball_location_curriculum") and declares a set of lessons (see "# ball_location lesson(s) specified here" comment) used to teach a concept. The keyword "train" indicates the concept by name (e.g., "ball_location") that the curriculum is to train; the keyword "with" specifies a subsequent training data-source type (e.g., a simulator, a training-data generator, a training-data database) that should be used with the curriculum followed by the training data-source name (e.g., "breakout_simulator"); and the keyword "objective" specifies the goal (e.g., ball_location_distance) used to evaluate the neural network's performance and, thus, a termination condition for the concept node to be trained. As such, the "ball_location_curriculum" trains the concept "ball_location" using the Breakout simulator named "breakout_simulator." In the "ball_location_curriculum," the "ball_location" concept is trained using a different objective function than the "get_high_score_curriculum," namely "ball_location_distance," which measures the distance between the AI model's prediction of the ball location and the actual ball location as calculated inside the simulator's simulation.

In view of the foregoing, the pedagogical programming language Inkling™ can be configured to enable an author to define each of the one or more curriculums by name; the concept node to be trained; training data-source type; training data-source name; one or more lessons of the curriculum for the concept node to be trained; and objective for the concept node to be trained. A termination condition for the objective is detailed further with respect to the one or more lessons of the curriculum.

Going back to the book analogy, the book can be the curriculum and the lessons can be individual chapters in the book. Every curriculum for teaching a concept will have one or more lessons, which lessons are declared within the context of a curriculum (e.g., see foregoing "# get_high_score lesson(s) specified here" and "# ball_location lesson(s) specified here" comments). Lessons give the programmer control over neural-network training. For example, the following Inkling™ code block declares a lesson, namely "score_lesson" for the "get_high_score_curriculum" for training the foregoing "get_high_score" concept:

```
lesson score_lesson
    configure
        constrain bricks_percent=0.5,
        constrain level=1,
        constrain paddle_width=4
    until
        maximize score
```

For another example, the following Inkling™ code block declares two lessons, namely "no_bricks" and "more_bricks," for the "ball_location_curriculum" for training the foregoing "ball_location" concept:

```
lesson no_bricks
    configure
        constrain bricks_percent=0.5,
        constrain level=1,
        constrain paddle_width=4
    until
        minimize ball_location_distance
lesson more_bricks follows no_bricks
    configure
        constrain bricks_percent=0.8,
        constrain level=20,
        constrain paddle_width=1
    until
        minimize ball_location_distance
```

In the foregoing Inkling™ code block for the "score_lesson," the keyword "lesson" names the lesson (e.g., "score_lesson") while the keyword "configure" declares a configuration for training data for the lesson, which provides guidance to the instructor module as to how to configure training for the neural network. In this example, the keyword "constrain" constrains schema-defined fields such as "bricks_percent," "level," and "paddle width," wherein "bricks_percent" is limited to 0.5%, "level" is constrained to level 1, and "paddle width" is limited to 4 in the Breakout simulator. The keyword "until" specifies training for the neural network should be continued until the return value for objective function "score" is maximized per the keyword "maximize." Once training starts, the AI engine can configure and play the simulator until the AI model maximizes the score as best it can or training is terminated by some other condition.

In the foregoing Inkling™ code block for the "no_bricks" lesson, the keyword "lesson" is also used to name the lesson (e.g., "no_bricks") and the keyword "configure" is used to declare a configuration for training data for the lesson, which happens to use the same constraints as the "score_lesson." The keyword "until" is also used in the "no_bricks" lesson to specify how extensive training for the neural network should be; however, the return value for objective function "ball_location_distance" for the "no_bricks" lesson is to be minimized per the keyword "minimize."

In the foregoing Inkling™ code block for the "more_bricks" lesson, the keyword "lesson" names the lesson (e.g., "more_bricks"), and the optional keyword "follows" indicates a preceding lesson (e.g., "no_bricks"), which can be used to specify an order of lessons in a curriculum for training a concept. If not the keyword "follows" is not used to specify an order of lessons, lessons are executed in parallel, which slows training of the neural network. Again, the keyword "configure" declares a configuration for training data for the lesson, which, in this case, constrains the schema-defined "bricks_percent" to 0.8%, "level" to level 20, and "paddle width" to 1 in the Breakout simulator. Like the "no_bricks" lesson, the objective function "ball_location_distance" for the "more_bricks" lesson is to be minimized per the keyword "minimize."

Lessons can determine an amount of time it takes for training a neural network. More complex lessons can build on other, simpler lessons to reduce the amount of time it takes for training a neural network. For example, if a neural network is to be trained on the "ball_location" concept with the "ball_location_curriculum," the neural network can be firstly trained with the "no_bricks" lesson, which describes an easier version of Breakout with fewer bricks (e.g., constrain bricks_percent=0.5), a lower level (e.g., constrain level=1), and a wider paddle (e.g., constrain paddle_width=4). Once the AI model consistently returns minimized values for the objective function "ball_location_distance" for the easier environment of the "no_bricks" lesson, the neural network can be secondly trained with the "more_bricks" lesson, which describes a more difficult version of Breakout with more complexity including more bricks (e.g., constrain bricks_percent=0.8), a higher level (e.g., constrain level=20), and a narrower paddle (e.g., constrain paddle_width=1). In this way, the AI model can progress from an easier environment to more and more complex environments.

In view of the foregoing, the pedagogical programming language Inkling™ can be configured to enable an author to define each of the one or more lessons by name; a leading lesson to follow via keyword "follows"; data configuration for the lesson via keyword "configure"; and the termination condition for the curriculum-defined objective for the concept node to be trained.

Schemas

Schema references or schemas in Inkling™ describe data types or the structure of data such as input data for a mental model, data between one or more concept nodes of a mental model, data between one or more stream nodes of a mental model, and output data of a mental model. Because the architect module maps one or more nodes of a mental model onto one or more nodes of a neural network, schemas also describe the structure of data such as input data into a neural network, data among nodes of a neural network, and output data of a neural network. As such, the pedagogical programming language Inkling™ is configured to enable an author to define schemas describing one or more data types to be streamed through a mental model including one or more concept nodes and one or more stream nodes.

Data types are the most basic building blocks for data manipulation. A data type provides information regarding the meaning of corresponding data, the possible values of the data, the operations that can be performed on the data, and the way the data can be stored. Supported data types in Inkling™ include, but are not limited to, primitive data types, which include data types selected from strings (e.g., String), integers (e.g., Int8, Int16, Int32, Int64, UInt8, UInt16, UInt32, UInt64), floats (e.g., Double, Float64, Float32), and Booleans (e.g., Bool); structured data types (e.g., structured data types for machine learning); constrained data types with range expressions limiting the data of the constrained data types including primitive data types constrained with a range expression; native data types such as data types for working with media formats (e.g., images, audio, video, etc.); and combinations thereof. For native data types, metadata from, for example, media formats such as images, audio, and video can be used to guide training of a neural network and improve learning of the neural network.

Schemas are expressed as records and can include a set of one or more fields, each of which fields can have a name and a data type that can be used for data manipulation. Schemas expressed as named records are named schemas, while schemas expressed as unnamed records are anonymous schemas. For example, a schema including a set of one or more field declarations in the record where the schema name would otherwise appear can be an anonymous schema. The following Inkling™ code blocks, for example, declares schemas used in the examples herein above, namely "GameState" "PlayerMove," and "BreakoutConfig":

```
schema GameState
(
    Luminance(84, 84) pixels # board state
)
schema PlayerMove
(
    String{"left", "no move", "right"} move
)
schema BreakoutConfig
(
    UInt32 level, # 'level', 'paddle_width', 'bricks_percent'
    UInt8 paddle_width, # are matched below in constrain clauses
    Float32 bricks_percent
)
```

With respect to the foregoing Inkling™ code blocks, the schema "GameState" is configured to represent input such as a grayscale image of a Breakout screen from the Breakout simulator. "Luminance" names a structured data type used in machine learning, which declares the input is a grayscale image of the Breakout screen where the values of the data are floats between 0 (black) and 1 (white). The schema "PlayerMove" is configured to represent output such as moves available for the Breakout paddle. "String" names a primitive data type, which declares the output is a move to the left, no move, or a move to the right. Likewise, the schema "BreakoutConfig" is configured to represent data regarding different configurations or aspects of Breakout play including level, paddle width, and percent of bricks on a screen. "UInt32" names a primitive data type for the level using an unsigned 32-bit integer; "Uint8" names a primitive data type for the paddle width using an unsigned 8-bit integer; and "Float32" names a primitive data type for the percent of bricks on the screen using a 32-bit float.

The compiler can be configured to check (e.g., static check) to verify that the schemas in an Inkling™ file are valid in the context in which they are used. However, the compiler does not enforce the schema—a streaming demon enforces the schema. Upon executing the compiler on an Inkling™ file, the compiler can match-check the schemas and report one or more errors if the schemas expected to match do not match. The match-check is structural, not name based. Field names do not matter. For example, the match-check is structural in that a pair of the schemas with different schema names can match if the pair of the schemas define the same list of field types in the same order. For structured data types with size, the sizes must be equal. In addition, two references by name to the same schema match because a schema matches itself. Two anonymous schemas match if both anonymous schemas define the same field types in the same order. And a schema referenced by name matches an anonymous schema if both define the same field types in the same order.

An external entity of code undergoes separate compilation and (in the case of a model) training than the concept built by the modules of the AI engine, which uses the external entity of code.

Blocks

A block in Inkling™ is a unit of reuse. A block is a collection of one or more schemas, one or more concept nodes, one or more stream nodes, or a combination thereof that can be used and reused by an Inkling™ author; however, blocks do not include any curriculums. Authors do not need to know the internals of a block. A block can include a single input and a single output using reserved names for the input and the output. A block can use an import statement to access concepts and streams outside the block.

A block encapsulates a portion of a mental model. Each block in an Inkling™ file can include one or more block-encapsulated concept nodes, one or more block-encapsulated stream nodes, and one or more block-encapsulated schemas without any curriculums for training the neural network. Each block in an Inkling™ file can be configured to accept input from any one or more of the one or more concept nodes or the one or more stream nodes of the mental model, as well as provide output to any other one of the one or more concept nodes or the one or more stream nodes of the mental model.

Other features of the AI systems and methods provided herein can be better understood with reference to the following:

Foundational Primitives

AI systems and methods provided herein enable a teaching-oriented approach by providing a set of foundational primitives that can be used to represent AI without specifying how the AI is created. These foundational primitives are 1) concepts and mental models, 2) curricula and lessons, and 3) training-data sources, as described in further detail herein. Concepts and mental models, as well as curricula and lessons, can be expressed in a pedagogical programming language such as Inkling™.

AI Engine

The AI system 500 enables developers to more efficiently build, teach, and use intelligence models.

The AI engine takes in a description of a problem and how one would go about teaching concepts covering aspects of the problem to be solved, and the AI engine compiles the coded description into lower-level structured data objects that a machine can more readily understand, builds a network topology of the main problem concept and concepts covering aspects of the problem to be solved, trains codified instantiations of the concepts and main task, and executes a trained AI model containing one, two, or more neural networks.

The AI engine can abstract away and automate the low-level mechanics of AI, and the AI engine can manage and automate much of the lower level complexities of working with AI. Each program (e.g., Inkling™ program) developed can be fed into the AI engine in order to generate and train appropriate artificial intelligence models, which, in some examples, can be referred to as Basic Recurrent Artificial Intelligence Networks ("BRAINs") herein. At its heart, a BRAIN can be a topology or a basic network of intelligent processing nodes that comprise a potentially recurrent network, hence the acronym "BRAIN."

The AI engine can abstract generation of a neural network topology for an optimal solution and faster training time with a curriculum and lessons to teach the neural network via recursive simulations and training sessions on each node making up the neural network.

The AI engine can contain a vast array of machine learning algorithms for various AI models, has logic for picking learning algorithms and guiding training, manages data streaming and data storage, and provides the efficient allocation of hardware resources. The AI engine can be built with an infrastructure that supports streaming data efficiently through the system, and the AI engine can use a set of heuristics to make choices about which learning algorithms to use to train each AI model. The set of heuristics also make it possible for the AI engine to choose from any number of possible algorithms, topologies, etc., train a number of AI models in parallel, and pick the best result.

The AI engine can be a cloud-hosted platform-as-a-service configured to manage complexities inherent to training AI networks. Thus, the AI engine can be accessible with one or more client-side interfaces to allow third parties to submit a description of a problem in a pedagogical programming language and let the online AI engine build and generate a trained intelligence model for one or more of the third parties.

Major AI-System Components

FIG. 5 provides a block diagram of an AI engine using an interface infrastructure to allow uploading of user code and data from their local development environment into the AI engine learning framework, via the user files specified in a file, such as a project file, associated with the container in accordance with an embodiment.

The details for any given implementation of a BRAIN server may vary substantially, but many have common architectural components such as the following six components: 1) an architect module, 2) an instructor module, 3) a learner module, 4) a hyperlearner module, 5) a compiler, and 6) one or more interfaces exchanging communications into and out of the AI engine.

Following on the AI system 200 of FIGS. 2A and 3A, the AI system 500 includes the coder 212 on the one or more client systems and the following on the one or more server systems: the compiler 222; the AI-generator modules including the instructor module 324, the architect module 326, and the learner module 328, the hyperlearner module 325, and the predictor module 329. In addition to the foregoing, the AI system 500 can include a training data loader 521 configured to load training data, a training data database 514a, a simulator 514b (optionally on a client system in an on-premises installation), and a streaming data server 523. The training data can be batched training data, streamed training data, or a combination thereof, and a training data manager can be configured to push or pull the training data from one or more training data sources selected from a simulator, a training-data generator, a training-data database, or a combination thereof. A batch data source can supply batched data from a database in at least one embodiment. A random-data generator can generate random data based on user-input parameters. Further in addition to the foregoing, FIG. 5 shows the architect module 326 configured to propose a neural network layout such as the neural network layout 102 and the learner module 328 configured to save a trained state of a neural network such as the trained neural network 106.

Architect Module

The architect module is the component of the system responsible for proposing and optimizing learning topologies (e.g., neural networks) based on mental models.

Referring to FIG. 9, neural networks 1010 can be based on a large collection of neural units loosely modeling the way a biological brain solves problems with large clusters of biological neurons connected by axons. Each neural unit is connected with many others, and links can be enforcing or inhibitory in their effect on the activation state of connected neural units. Each individual neural unit can have, for example, a summation function, which combines the values of all its inputs together. There may be a threshold function or limiting function on each connection and on the unit itself such that it must surpass it before it can propagate to other neurons. These systems are self-learning and trained rather than explicitly programmed and excel in areas where the solution or feature detection is difficult to express in a traditional computer program.

Neural networks can consist of multiple layers or a cube design, and the signal path can traverse from front to back. The goal of the neural network is to solve problems in the same way that the human brain would, although several neural networks are much more abstract. Modern neural network projects typically work with a few thousand and up to a few million neural units and millions of connections.

The architect module is coded and configured to take in the codified mental model and pedagogy and then propose a set of candidate low-level learning algorithms, topologies of a main task and concepts making up that main task, and configurations thereof the architect module believes will best be able to learn the concepts in the model. This is akin to the work that a data scientist does in the toolkit approach, or that the search system automates in the approach with statistical data analysis tools. Here, it is guided by the pedagogical program instead of being a broad search. The architect module can employ a variety of techniques to identify such models. The architect module can generate a directed graph of nodes or a low-level instantiation of a high-level mental model. The architect module can break down the problem to be solved into smaller tasks/concepts all factoring into the more complex main problem trying to be solved. The architect module can instantiate a main task and layers of concepts feeding into the main task. The architect module can generate each concept including the concepts with a tap that stores the output action/decision and the reason why that node reached that resultant output (e.g., what parameters dominated the decision and/or other factors that caused the node to reach that resultant output). This stored output of resultant output and the reasons why the node reached that resultant output can be stored in the trained intelligence model. The tap created in each instantiated node allows explainability for each step in an intelligence model on how a trained intelligence model produces its resultant output for a set of data input. The architect module can reference a database of algorithms to use as well as a database of network topologies to utilize. The architect module can reference a table or database of best suggested topology arrangements including how many layers of levels in a topology graph for a given problem, if available. The architect module also has logic to reference similar problems solved by comparing signatures. If the signatures are close enough, the architect module can try the topology used to optimally solve a problem stored in an archive database with a similar signature. The architect module can also instantiate multiple topology arrangements all to be tested and simulated in parallel to see which topology comes away with optimal results. The optimal results can be based on factors such as performance time, accuracy, computing resources needed to complete the training simulations, etc.

In an embodiment, for example, the architect module can be configured to propose a number of neural networks and heuristically pick an appropriate learning algorithm from a number of machine learning algorithms in one or more databases for each of the number of neural networks. The instructor module and the learner module can be configured to train the number of neural networks in parallel. The number of neural networks can be trained in one or more training cycles with the training data from one or more training data sources. The AI engine or a predictor module thereof can subsequently instantiate a number of trained neural networks based on the concepts learned by the number of neural networks in the one or more training cycles, and the AI engine can identify a best trained neural network (e.g., by means of optimal results based on factors such as performance time, accuracy, etc.) among the number of trained neural networks.

The user can assist in building the topology of the nodes by setting dependencies for particular nodes. The architect module can generate and instantiate neural network topologies for all of the concepts needed to solve the problem in a distinct two-step process. The architect module can generate a description of the network concepts. The architect module can also take the description and instantiate one or more topological shapes, layers, or other graphical arrangements to solve the problem description. The architect module can select topology algorithms to use based on factors such as whether the type of output the current problem has either 1) an estimation output or 2) a discrete output and then factors in other parameters such as performance time to complete the algorithm, accuracy, computing resources needed to complete the training simulations, originality, amount of attributes, etc.

Instructor Module

The instructor module is a component of the system responsible for carrying out a training plan codified in a pedagogical programming language such as Inkling™. Training can include teaching a neural network to get one or more outcomes, for example, on a simulator. The training can involve using a specific set of concepts, a curriculum, and lessons, which can be described in an Inkling™ file. The instructor module can train easier-to-understand tasks earlier than more complex tasks. Thus, the instructor module can train concept nodes and then higher-level nodes. The instructor module can train concept nodes that are dependent on other nodes after those other nodes are trained. However, multiple nodes in a graph may be trained in parallel. The instructor module can run simulations on the nodes with input data including statistics and feedback on results from the node being trained from the learner module. The learner module and the instructor module can work with a simulator or other data source to iteratively train a node with different data inputs. The instructor module can reference a knowledge base of how to train a node efficiently by different ways of flowing data to one or more nodes in the topology graph in parallel, or, if dependencies exist, the instructor module can train serially with some portions of lessons taking place only after earlier dependencies have been satisfied. The instructor module can reference the dependencies in the topology graph, which the dependencies can come from a user specifying the dependencies and/or how the arrangement of nodes in the topology was instantiated. The instructor module can supply data flows from the data source such as a simulator in parallel to multiple nodes at the same time where computing resources and a dependency check allows the parallel training.

Learner Module

The learner module is a component of the system configured to carry out the actual execution of the low-level, underlying AI algorithms. In training mode, the learner module can instantiate training a system of nodes conforming to what was proposed by the architect module, interface with the instructor module to carry out the computation and assess performance, and then execute the learning algorithm itself. In execution mode, the learner module can instantiate and execute an instance of the already trained system.

Eventually, the learner module writes out network states for each trained sub-node and then a combination of the topological graph of the main node with all of the sub-nodes into a trained artificial intelligence model referred to herein as a BRAIN. The learner module can also write the stored output of each node and why that node arrived at that output into the BRAIN, which gives explainability as to how and why the AI proposes a solution or arrives at an outcome.

Hyperlearner Module

The hyperlearner module can perform a comparison of a current problem to a previous problem in one or more databases. The hyperlearner module can reference archived, previously built and trained intelligence models to help guide the instructor module to train the current model of nodes. The hyperlearner module can parse an archive database of trained intelligence models, known past similar problems and proposed solutions, and other sources. The hyperlearner module can compare previous solutions similar to the solutions needed in a current problem as well as compare previous problems similar to the current problem to suggest potential optimal neural network topologies and training lessons and training methodologies.

Transformer

The transformer module can carry out streaming data transformations that do not require learning. When authors create AI models, some concepts do not require learning and code specifying explicitly how to calculate them can be specified. For example, if an author wants to use the concept of a moving average, rather than have the system learn how to calculate the moving average, the author can explicitly specify how to calculate the moving average. Such transformations take the form of "stream" statements in Inkling™. The transformer module can carry out the actual execution of such transformations when needed.

Predictor Module

After an algorithm is trained, the trained neural network can be hosted in a "prediction mode." The prediction mode can hold a neural network for use as an HTTP API endpoint. The programmer can then send input data to the predictor module and get back a prediction.

Compiler

The compiler module automates conversion and compiling of the pedagogical programming language describing the problem (main task) and concepts factoring into the problem. Each statement recited in the pedagogical programming language can be complied into a structured data object's defined fields, which can later be generated and instantiated into its own concept node by the architect module. Each node can have one or more inputs one or more neural networks to process the input data and a resulting output decision/action. The compiled statements, commands, and other codifications fed into the AI compiler can be transformed into a lower level AI specification.

Client-Server Interfaces

The AI system provided herein can include one or more client-server interfaces selected from at least a command-line interface, a graphical interface, a web-based interface, or a combination thereof. Each of the client-server interfaces includes a client-side client-server interface and a server-side client-server interface configured to cooperate or communicate with each other such that a user on a client can work online with a server including the AI engine. As such, one or more server-side client-server interfaces are configured to respectively cooperate with one or more client-side client-server interfaces and vice versa. In a first example of a client-server interface, namely a web-based interface, a client-side web-based interface (e.g., a web browser-based application used in a textual or graphical user environment) is configured to cooperate with a server-side web-based interface. In a second example of a client-server interface, namely a command-line interface, a client-side command-line interface (e.g., a command line-based application used in command-line interpreter such as Bash or cmd.exe) is configured to cooperate with a server-side command-line interface.

Graphical Interface

A graphical interface can include web-based interface through, for example, a browser, and the graphical interface can include a non-web-based interface accessed through, for example, a native client application other than a web browser such as an integrated development environment. The graphical interface can be configured to, for example, request information for creating a new AI model such as a name for the new AI model, a description for the new AI model, and a link to store code the new AI model is to execute.

With respect to a web-based interface, the graphical interface can include an open tab or a portion thereof in a browser, a pop-up window of the browser, a pop-under window of the browser, a plugin element of the browser, or any other browser element configured to request and accept input. The web-based interface can include a browser-based tool configured to access a web site for configuring and analyzing AI models stored in the AI engine. The web site can be used for sharing, collaborating, and learning. Some information that can be accessed from the web site is a visualization of a AI model's training progress.

With respect to a non-web-based interface, the graphical interface can likewise represent an open tab or a portion thereof, a pop-up window, a pop-under window, a plugin element, or any other element configured to request and accept input such as a dialog box, wherein the graphical interface is the native client application other than the web browser.

Command Line Interface ("CLI")

A command-line interface can include a command line-based program used in a command-line interpreter such as Bash or cmd.exe. Alternatively, the command-line interface can include a web-based interface through, for example, a browser or any browser element thereof, which browser can be textual or graphical. The command-line interface can be configured to request information through a prompt for creating a new AI model such as a name for the new AI model.

The CLI can be configured to enable users to configure the AI engine. The CLI is especially useful for automation and connection (e.g., via piping) to other tools. Some actions that can be performed using the CLI include starting and naming a AI model, loading an Inkling™ file, training the AI model, and connecting the AI model to a simulator.

Simulator

If the curriculum trains using a simulation or procedural generation, the data for a lesson is not data to be passed to the learning system, but data is to be passed to the simulator. Otherwise, then the data can be optionally filtered/augmented in the lessons before being passed to the learning system. The simulator can use this data to configure itself, and the simulator can subsequently produce a piece of data for the learning system to use for training. This separation permits a proper separation of concerns. The simulator is the method of instruction, and the lesson provides a way to tune that method of instruction, which makes it more or less difficult depending on the current level of mastery exhibited by the learning system. A simulation can run on a client machine and stream data to the AI engine for training. In such an embodiment, the client machine needs to remain connected to the AI engine while the AI model is training. However, if the client machine is disconnected from the server of the AI engine, it can automatically pick up where it left off when it is reconnected.

Note, 1) simulations and procedural generation are a good choice versus data in a variety of circumstances; and 2) concepts are a good choice versus streams when you can more easily teach versus calculate.

Simulators can be reused to teach multiple concepts.

Modes of Operation

A BRAIN server has at least three modes of operation: authoring/debugging, training, and execution (or prediction). In practice, all three can run concurrently, and most implementations of a BRAIN server are high-availability, multi-tenant, distributed systems. That being said, each individual user generally works in one mode of operation at a time.

Authoring/Debugging Mode

When in authoring/debugging mode of operation, a BRAIN server can be tuned to assisting a user in iteratively developing a mental model and pedagogy. For example, in the authoring/debugging mode a user can set breakpoints on nodes in an AI model, and when a breakpoint is hit the user can inspect the chain of stream processing leading up to that node. Even though a given node can represent a neural network or other complex AI learning system, because of the way training is conducted, the system can encode and decode from high-dimensional tensor representations into the output types associated with a concept. This does not mean that high-dimensional representations are necessarily collapsed between nodes, just that decoders are learned for all nodes. In addition to this direct model-inspection capability, an author can similarly debug curricula. For example, one can set a watch condition on a particular lesson and compare the actual training performance and adapted learning execution plan versus the canonical, codified lesson ordering. Advanced users can inspect the underlying learning algorithms themselves, and debugging tooling can assist in visualizing what was actually learned in concepts that are not understood as intended.

Since many developers might be concurrently working on a given BRAIN model, the authoring mode also handles keeping representations that are under development, in training, and deployed separate.

Training Mode

When in training mode of operation, the instructor module and the learner module are configured to i) instantiate the neural network conforming to the neural network proposed by the architect module and ii) train the neural network. To effect the foregoing, the BRAIN server can take compiled code and generate a BRAIN learning topology, and proceed to follow the curricula to teach the concepts as specified. Depending on the model, training can potentially take substantial amounts of time. Consequently, the BRAIN server can provide interactive context on the status of training. For example, the BRAIN server can show which nodes are actively being trained, the current belief about each node's mastery of its associated concept, overall and fine-grained accuracy and performance, the current training execution plan, and an estimate of completion time. As such, in an embodiment, the AI engine can be configured to provide one or more training status updates on training a neural network selected from i) an estimation of a proportion of a training plan completed for the neural network, ii) an estimation of a completion time for completing the training plan, iii) the one or more concepts upon which the neural network is actively training, iv) mastery of the neural network on learning the one or more concepts, v) fine-grained accuracy and performance of the neural network on learning the one or more concepts, and vi) overall accuracy and performance of the neural network on learning one or more mental models.

Because the process of building pedagogical programs is iterative, the BRAIN server in training mode can also provide incremental training. That is to say, if the programming code is altered with respect to a concept that comes after other concepts that have already been trained, those antecedent concepts do not need to be retrained.

Additionally, in training mode, the user is able to specify what constitutes satisfactory training should the program itself permit indefinite training.

When starting a training operation, the instructor module can first generate an execution plan. This is the ordering the instructor module intends to use when teaching the concepts, and, for each concept, the lessons the instructor module intends to teach in what order. While the execution plan is executing, the instructor module can jump back and forth between concepts and lessons to optimize the learning rate. By not being required to train each concept fully before starting to train dependent concepts, the system can naturally avoid certain systemic machine-learning problems such as overfitting. The major techniques used to determine when to switch between lessons and concepts for training are reinforcement learning and adaptive learning. For example, for a first main problem of determining an amount of bankruptcy filings in the United States, a first sub-node can be trained in a first lesson on how to determine bankruptcy filings in California. A second lesson can train the first sub-node on how to determine bankruptcy filings in California and York. Successive lessons on a node can build upon and augment earlier lessons that the node was trained on in a training session.

Execution Mode

When in execution mode or prediction mode of operation, a predictor AI module can be configured to i) instantiate and execute the trained neural network on the training data for one or more predictions in the predicting mode. To effect the foregoing, a BRAIN server can take a trained BRAIN model, enable API endpoints so that data can be streamed to and from the model, and then optimize its distribution for performance. Because learned and specified data transformations can be functional in nature, the transformations can be automatically parallelized and distributed to hardware that can accelerate their execution. Text processing, for example, can be distributed to a cluster of machines with substantial CPU resources, while nodes leveraging deep learning might be similarly distributed to a cluster of machines with substantial GPU resources.

Operational management of the executing BRAIN model can also be undertaken in this mode. This includes monitoring data ingestion rates, execution performance (both in terms of speed and accuracy), logs, event subscriptions, or the like through an operational dashboard.

Other features of the AI systems and methods provided herein for authoring/debugging, training, and execution (or prediction) can be better understood with reference to the following:

Algorithm Selection

A first step a BRAIN server can take is to pick an appropriate learning algorithm to train a mental model. This is a notable step in training AI, and it is a step those without AI expertise cannot perform without expert guidance. The BRAIN server can have knowledge of many of the available learning algorithms, as well as a set of heuristics for picking an appropriate algorithm including an initial configuration to train from.

For example, if the BRAIN server picks Deep Q-Learning for training a mental model, it would also pick an appropriate topology, hyper-parameters, and initial weight values for synapses. A benefit of having the heuristics available to be used programmatically is that the BRAIN server is not limited to a single choice; it can select any number of possible algorithms, topologies, etc., train a number of AI models in parallel, and pick the best result.

The process of picking an appropriate algorithm, etc., is performed by an AI model that has been trained (and will continue to be trained) by the AI engine, meaning the AI model for algorithm selection will get better at building AI models each time a new one is built. A trained AI-engine neural network, such as a BRAIN, thereby provides enabling AI for proposing neural networks from assembly code and picking appropriate learning algorithms from a number of machine learning algorithms in one or more databases for training the neural networks. The AI engine can be configured to continuously train the trained AI-engine neural network in providing the enabling AI for proposing the neural networks and picking the appropriate learning algorithms thereby getting better at building AI models.

The architect module can also use heuristics, mental model signatures, statistical distribution inference, and meta-learning in topology and algorithm selection:

First, the architect module can be configured to heuristically pick an appropriate learning algorithm from a number of machine learning algorithms in one or more databases for training the neural network proposed by the architect module. Many heuristics regarding the mental model can be used to inform what types of AI and machine learning algorithms can be used. For example, the data types used have a large influence. For this reason, the Inkling™ language contains rich native data types in addition to the basic data types. If the architect module sees, for example, that an image is being used, a convolutional deep learning neural network architecture might be appropriate. If the architect module sees data that is temporal in nature (e.g., audio data, sequence data, etc.), then a recursive deep-learning neural network architecture like a long short-term memory ("LSTM") network might be more appropriate. The collection of heuristics can be generated by data science and machine learning/AI experts who work on the architect module codebase, and who attempt to capture the heuristics that they themselves use in practice.

The system can also calculate a signature for a mental model. These signatures are a form of hashing such that mental models that have similar machine learning algorithmic characteristics have similar signatures. These signatures can then be used in conjunction with heuristics and with meta-learning.

In addition to looking at the mental model, the architect module can also consider the pedagogy provided in the programming code. It can, for example, look at the statistical distribution of any data sets being used; and, in the case of simulators, it can ask the simulator to generate substantial amounts of data so as to determine the statistics of data that will be used during training. These distribution properties can further inform the heuristics used.

Meta learning is an advanced technique used by the architect module. It is, as the name implies, learning about learning. What this means is that as the architect module can generate candidate algorithm choices and topologies for training, it can record this data along with the signature for the model and the resultant system performance. This data set can then be used in its own learning system. Thus the architect module, by virtue of proposing, exploring, and optimizing learning models, can observe what works and what doesn't, and use that to learn what models it should try in the future when it sees similar signatures.

To effect meta-learning, the AI engine can include a meta-learning module configured to keep a record such as a meta-learning record in one or more databases. The record can include i) the source code processed by the AI engine, ii) mental models of the source code and/or signatures thereof, iii) the training data used for training the neural networks, iv) the trained neural networks, v) how quickly the trained neural networks were trained to a sufficient level of accuracy, and vi) how accurate the trained neural networks became in making predictions on the training data.

For advanced users, low-level details of a learning topology can be explicitly specified completely or in part. The architect module can treat any such pinning of parameters as an override on its default behavior. In this way, specific algorithms can be provided, or a generated model can be pinned for manual refinement.

Guiding Training

Once an algorithm is chosen, the BRAIN server can proceed with training the BRAIN's mental model via curricula and the lessons thereof. The BRAIN server can manage the data streaming, data storage, efficient allocation of hardware resources, choosing when to train each concept, how much (or little) to train a concept given its relevance within the mental model (e.g., dealing with problems of overfitting and underfitting), and is generally responsible for producing a trained BRAIN based on the given mental model and curricula. The AI engine is thus configured to make determinations regarding i) when to train the neural network on each of the one or more concepts and ii) how extensively to train the neural network on each of the one or more concepts. Such determinations can be based on the relevance of each of one or more concepts in one or more predictions of a trained neural network based upon training data.

As is the case with picking an appropriate learning algorithm, guiding training—notably avoiding overfitting and underfitting—to produce an accurate AI solution is a task that requires knowledge and experience in training AIs, and the BRAIN server can have an encoded set of heuristics to manage this with little or no user involvement. Similarly, the process of guiding training is also a BRAIN that has been trained that will only get smarter with each BRAIN it trains.

The AI engine can also determine when to train each concept, how much (or little) to train each concept based on its relevance, and, ultimately, produce a trained BRAIN. Furthermore, the AI engine can utilize meta-learning. In meta-learning, the AI engine keeps a record of each program it's seen, the data it used for training, and the generated AIs that it made. It also records how fast those AIs trained and how accurate they became. The AI engine server learns over that dataset.

Stream Oriented, Data-Flow Processing

A BRAIN server can, under the hood, operate on streams of data, and can thus be considered a data flow-processing system. Data can be streamed into the BRAIN server through a traditional program, the data can flow through the nodes in the BRAIN model (including recurrent flows), and processed output can be made available in either an immediate or asynchronous, event-based model to the caller. All data that flows through the system can be ephemeral, unless a user explicitly creates a persisted data store in their program. At its heart, a BRAIN can be a basic network of intelligent processing nodes that comprise a potentially recurrent network, hence the acronym "BRAIN."

Learning Backends

Learning backends encode underlying detail needed to work with a particular AI or machine learning algorithm. The BRAIN server can provide many backends such as backends for deep learning. However, learning-algorithm authors can provide their own backends if desired. By architecting the BRAIN server in this way, programming code (e.g., Inkling™ code) includes another level of abstraction from a particular approach. If a new learning algorithm is created that has superior performance to existing algorithms, all that need be added is a new backend. The architect module can then immediately start using the backend to build systems, and existing programs can be recompiled without modification to take advantage of the improved algorithms.

Learning backends use the schemas set forth in Inkling™ to translate big matrices to usable values.

Online Learning

In addition to capabilities for migrating learned state, some implementations of the BRAIN server afford features to enable online learning. Since online learning can break the pure functional nature of nodes via state changes during runtime, another strategy that the system is configured to afford is persisting training data learned online using a data daemon, incrementally training the network at set intervals, and then redistributing the updated network as a functional block throughout the BRAIN server.

Migrations of Learned State

When a system has undergone substantial training achieving a learned state, and a subsequent change to the underlying mental models might necessitate retraining, it could be desirable to migrate the learned state rather than starting training from scratch. The BRAIN server can be configured to afford transitioning capabilities such that previously learned high dimensional representations can be migrated to appropriate, new, high dimensional representations. This can be achieved in a neural network by, for example, expanding the width of an input layer to account for alterations with zero-weight connections to downstream layers. The system can then artificially diminish the weights on connections from the input that are to be pruned until they hit zero and can then be fully pruned.

Deploy and Use

Once a BRAIN has been sufficiently trained, it can be deployed such that it can be used in a production application. The interface for using a deployed BRAIN is simple: the user submits data (of the same type as the BRAIN was trained with) to a BRAIN-server API and receives the BRAIN's evaluation of that data.

As a practical example of how to use a deployed BRAIN, a BRAIN can first be trained to recognize hand-written digits from the Mixed National Institute of Standards and Technology ("MNIST") dataset. An image can be created containing a handwritten digit, perhaps directly through a touch-based interface or indirectly by scanning a piece of paper with the handwritten digit written on it. The image can then be downsampled to a resolution of 28×28 and converted to grayscale, as this is the input schema used to train the example BRAIN. When submitted to the BRAIN-server through the BRAIN server API, the BRAIN can take the image as input and output a one-dimensional array of length 10 (whereby each array item represents the probability, as judged by the BRAIN, that the image is a digit corresponding to the index). The array could be the value returned to the user from the API, which the user could use as needed.

Though a linear approach to building a BRAIN is presented in an embodiment, an author-train-deploy workflow does not have to treated as a waterfall process. If the user decides further refinement of a BRAIN is needed, be it through additional training with existing data, additional training with new, supplemental data, or additional training with a modified version of the mental model or curricula used for training, the BRAIN-server is configured to support versioning of BRAINs so that the user can preserve (and possibly revert to) the current state of a BRAIN while refining the trained state of the BRAIN until a new, more satisfactory state is reached.

FIG. 6A provides a block diagram illustrating an AI system and its cloud-based computing platforms infrastructure in accordance with an embodiment.

As shown in FIG. 6A, a user such as a software developer can interface with the AI system 600A through an online interface; however, the user is not limited to the online interface, and the online interface is not limited to that shown in FIG. 6A. With this in mind, the AI system 600A of FIG. 6A can enable a user to make API and web requests through a domain name system ("DNS"), which requests can be optionally filtered through a proxy to route the API requests to an API load balancer and the web requests to a web load balancer. The API load balancer can be configured to distribute the API requests among multiple BRAIN service containers running in a Docker network or containerization platform configured to wrap one or more pieces of software in a complete filesystem containing everything for execution including code, runtime, system tools, system libraries, etc. The web load balancer can be configured to distribute the web requests among multiple web service containers running in the Docker network. The Docker network or Docker BRAIN network can include central processing unit ("CPU") nodes and graphics processing unit ("GPU") nodes, the nodes of which Docker network can be autoscaled as needed. The CPU nodes can be utilized for most BRAIN-service containers running on the Docker network, and the GPU nodes can be utilized for the more computationally intensive components such as TensorFlow and the learner module. As further shown in FIG. 6A, a BRAIN-service engineer can interface with the AI system 600A through virtual private cloud ("VPC") gateway and a hardened bastion host configured to secure the Docker network. An Elasticsearch-Logstash-Kibana ("ELK") stack cluster can be shared among all production clusters for dedicated monitoring and logging.

FIG. 6B provides a block diagram illustrating an AI system and its on-premises computing platforms infrastructure in accordance with an embodiment.

Following on the AI system 600A, the bastion host and one or more CPU nodes can be on a public subnet for bidirectional communication through an Internet gateway. One or more other CPU nodes, as well as the GPU nodes, can be on a private subnet communicatively coupled with the public subnet by means of a subnet there between. The one or more CPU nodes on the public subnet can be utilized by the compiler 222 of FIGS. 2A, 3A, and 5, and the architect module 326 of FIGS. 3A and 5. The one or more other CPU nodes on the private subnet can be utilized by the instructor module 324 of FIGS. 3A and 5, and the GPU nodes can be utilized by the learner module 328 and the predictor module 329 of FIGS. 3A and 5. As further shown in FIG. 6B, the private subnet can be configured to send outgoing communications to the Internet through a network address translation ("NAT") gateway.

Methods

One or more methods of an AI engine configured to work with a pedagogical programming language include, in an embodiment, enabling an author to define a mental model to be learned by an AI model using the pedagogical programming language, the mental model including an input, one or more concept nodes, one or more stream nodes, and an output; enabling an author to define one or more curriculums for training the AI model respectively on the one or more concept nodes using the pedagogical programming language; executing a compiler to generate an assembly code from a source code written in the pedagogical programming language; and executing one or more AI-engine modules including an architect module, an instructor module, and a learner module to process the assembly code. Upon executing the architect module, the architect module can be configured to propose a neural-network layout with one or more neural-network layers from the assembly code. Upon executing the learner module, the learner module can be configured to build the AI model with the one or more neural-network layers from the neural-network layout proposed by the architect module. Upon executing the instructor module, the instructor module can be configured to train the AI model built by the learner module on the one or more concept nodes respectively with the one or more curriculums.

In an embodiment, upon executing the architect module, the architect module can be further configured to map the one or more concept nodes of the mental model on the one or more network layers of the AI model. In an embodiment, upon executing the instructor module, the instructor module can be further configured to find a starting point among the one or more concept nodes and the corresponding one or more curriculums for training the AI model.

In an embodiment, upon executing the instructor module, the instructor module can be further configured to train the AI model in one or more training cycles with training data from one or more training-data sources selected from a simulator, a training-data generator, a training-data database, or a combination thereof. In an embodiment, upon executing the instructor module, the instructor module can be further configured to terminate neural-network training upon an instructor module-determined terminating condition.

In an embodiment, the method can further include enabling an author to define schemas using the pedagogical programming language, the schemas describing one or more data types to be streamed through the mental model including the one or more concept nodes and the one or more stream nodes.

In an embodiment, upon executing the compiler, the compiler can be further configured to match-check the schemas and report one or more errors if the schemas expected to match do not match, wherein the match-check is structural in that any pair of the schemas with different schema names match if the pair of the schemas define a same list of field types in a same order.

In an embodiment, the method can further include enabling an author to define each of the one or more concept nodes by name; prediction type; output; and one or more connecting concept nodes in the mental model including leading, input-providing concept nodes and following, output-accepting concept nodes using the pedagogical programming language. The prediction type can include a prediction type selected from a classifier, a predictor, an estimator, and a goal. In addition, the method can enable an author to define inputs and outputs of the mental model.

In an embodiment, the method can further include enabling an author to define each of the one or more curriculums by name; the concept node to be trained; training data-source type; training data-source name; one or more lessons of the curriculum for the concept node to be trained; and objective including a termination condition for the concept node to be trained using the pedagogical programming language. The training data-source type can include a training data-source type selected from a simulator, a training-data generator, and a training-data database.

In an embodiment, the method can further include enabling an author to define each of the one or more lessons by name; a leading lesson to follow; data configuration for the lesson; and the termination condition for the curriculum-defined objective for the concept node to be trained using the pedagogical programming language.

In an embodiment, the method can further include enabling an author to use and reuse one or more blocks in the mental model using the pedagogical programming language. Each block of the one or more blocks can include one or more block-encapsulated concept nodes, one or more block-encapsulated stream nodes, and one or more block-encapsulated schemas without any curriculums for training the AI model. Each block of the one or more blocks can be configured to accept input from any one or more of the one or more concept nodes or the one or more stream nodes of the mental model, as well as provide output to any other one of the one or more concept nodes or the one or more stream nodes of the mental model.

Network

FIG. 7 illustrates a number of electronic systems and devices communicating with each other in a network environment in accordance with an embodiment. The network environment 800 has a communications network 820. The network 820 can include one or more networks selected from an optical network, a cellular network, the Internet, a Local Area Network ("LAN"), a Wide Area Network ("WAN"), a satellite network, a fiber network, a cable network, and combinations thereof. In an embodiment, the communications network 820 is the Internet. As shown, there may be many server computing systems and many client computing systems connected to each other via the communications network 820. However, it should be appreciated that, for example, a single client computing system can also be connected to a single server computing system. As such, FIG. 7 illustrates any combination of server computing systems and client computing systems connected to each other via the communications network 820.

The communications network 820 can connect one or more server computing systems selected from at least a first server computing system 804A and a second server computing system 804B to each other and to at least one or more client computing systems as well. The server computing systems 804A and 804B can be, for example, the one or more server systems 220 of FIGS. 2A and 3A. The server computing systems 804A and 804B can respectively optionally include organized data structures such as databases 806A and 806B. Each of the one or more server computing systems can have one or more virtual server computing systems, and multiple virtual server computing systems can be implemented by design. Each of the one or more server computing systems can have one or more firewalls to protect data integrity.

The at least one or more client computing systems can be selected from a first mobile computing device 802A (e.g., smartphone with an Android-based operating system), a second mobile computing device 802E (e.g., smartphone with an iOS-based operating system), a first wearable electronic device 802C (e.g., a smartwatch), a first portable computer 802B (e.g., laptop computer), a third mobile computing device or second portable computer 802F (e.g., tablet with an Android- or iOS-based operating system), a smart device or system incorporated into a first smart automobile 802D, a smart device or system incorporated into a first smart bicycle 802G, a first smart television 802H, a first virtual reality or augmented reality headset 804C, and the like. The client computing system 802B can be, for example, one of the one or more client systems 210 of FIGS. 2A and 3A, and any one or more of the other client computing systems (e.g., 802A, 802C, 802D, 802E, 802F, 802G, 802H, and/or 804C) can include, for example, the software application or the hardware-based system in which the trained neural network 106 can be deployed. Each of the one or more client computing systems can have one or more firewalls to protect data integrity.

It should be appreciated that the use of the terms "client computing system" and "server computing system" is intended to indicate the system that generally initiates a communication and the system that generally responds to the communication. For example, a client computing system can generally initiate a communication and a server computing system generally responds to the communication. No hierarchy is implied unless explicitly stated. Both functions can be in a single communicating system or device, in which case, the client-server and server-client relationship can be viewed as peer-to-peer. Thus, if the first portable computer 802B (e.g., the client computing system) and the server computing system 804A can both initiate and respond to communications, their communications can be viewed as peer-to-peer. Additionally, the server computing systems 804A and 804B include circuitry and software enabling communication with each other across the network 820.

Any one or more of the server computing systems can be a cloud provider. A cloud provider can install and operate application software in a cloud (e.g., the network 820 such as the Internet) and cloud users can access the application software from one or more of the client computing systems. Generally, cloud users that have a cloud-based site in the cloud cannot solely manage a cloud infrastructure or platform where the application software runs. Thus, the server computing systems and organized data structures thereof can be shared resources, where each cloud user is given a certain amount of dedicated use of the shared resources. Each cloud user's cloud-based site can be given a virtual amount of dedicated space and bandwidth in the cloud. Cloud applications can be different from other applications in their scalability, which can be achieved by cloning tasks onto multiple virtual machines at run-time to meet changing work demand. Load balancers distribute the work over the set of virtual machines. This process is transparent to the cloud user, who sees only a single access point.

Cloud-based remote access can be coded to utilize a protocol, such as Hypertext Transfer Protocol ("HTTP"), to engage in a request and response cycle with an application on a client computing system such as a web-browser application resident on the client computing system. The cloud-based remote access can be accessed by a smartphone, a desktop computer, a tablet, or any other client computing systems, anytime and/or anywhere. The cloud-based remote access is coded to engage in 1) the request and response cycle from all web browser based applications, 3) the request and response cycle from a dedicated on-line server, 4) the request and response cycle directly between a native application resident on a client device and the cloud-based remote access to another client computing system, and 5) combinations of these.

In an embodiment, the server computing system 804A can include a server engine, a web page management component, a content management component, and a database management component. The server engine can perform basic processing and operating-system level tasks. The web page management component can handle creation and display or routing of web pages or screens associated with receiving and providing digital content and digital advertisements. Users (e.g., cloud users) can access one or more of the server computing systems by means of a Uniform Resource Locator ("URL") associated therewith. The content management component can handle most of the functions in the embodiments described herein. The database management component can include storage and retrieval tasks with respect to the database, queries to the database, and storage of data.

In an embodiment, a server computing system can be configured to display information in a window, a web page, or the like. An application including any program modules, applications, services, processes, and other similar software executable when executed on, for example, the server computing system 804A, can cause the server computing system 804A to display windows and user interface screens in a portion of a display screen space. With respect to a web page, for example, a user via a browser on the client computing system 802B can interact with the web page, and then supply input to the query/fields and/or service presented by the user interface screens. The web page can be served by a web server, for example, the server computing system 804A, on any Hypertext Markup Language ("HTML") or Wireless Access Protocol ("WAP") enabled client computing system (e.g., the client computing system 802B) or any equivalent thereof. The client computing system 802B can host a browser and/or a specific application to interact with the server computing system 804A. Each application has a code scripted to perform the functions that the software component is coded to carry out such as presenting fields to take details of desired information. Algorithms, routines, and engines within, for example, the server computing system 804A can take the information from the presenting fields and put that information into an appropriate storage medium such as a database (e.g., database 806A). A comparison wizard can be scripted to refer to a database and make use of such data. The applications may be hosted on, for example, the server computing system 804A and served to the specific application or browser of, for example, the client computing system 802B. The applications then serve windows or pages that allow entry of details.

Computing Systems

FIG. 8 illustrates a computing system 900 that can be, wholly or partially, part of one or more of the server or client computing devices in accordance with an embodiment. With reference to FIG. 8, components of the computing system 900 can include, but are not limited to, a processing unit 920 having one or more processing cores, a system memory 930, and a system bus 921 that couples various system components including the system memory 930 to the processing unit 920. The system bus 921 may be any of several types of bus structures selected from a memory bus or memory controller, a peripheral bus, and a local bus using any of a variety of bus architectures.

Computing system 900 typically includes a variety of computing machine-readable media. Computing machine-readable media can be any available media that can be accessed by computing system 900 and includes both volatile and nonvolatile media, and removable and non-removable media. By way of example, and not limitation, computing machine-readable media use includes storage of information, such as computer-readable instructions, data structures, other executable software or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media. As an example, some client computing systems on the network 820 of FIG. 7 might not have optical or magnetic storage.

The system memory 930 includes computer storage media in the form of volatile and/or nonvolatile memory such as read only memory (ROM) 931 and random access memory (RAM) 932. A basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. By way of example, and not limitation, FIG. 8 illustrates that RAM 932 can include a portion of the operating system 934, application programs 935, other executable software 936, and program data 937.

The computing system 900 can also include other removable/non-removable volatile/nonvolatile computer storage media. By way of example only, FIG. 8 illustrates a solid-state memory 941. Other removable/non-removable, volatile/nonvolatile computer storage media that can be used in the example operating environment include, but are not limited to, USB drives and devices, flash memory cards, solid state RAM, solid state ROM, and the like. The solid-state memory 941 is typically connected to the system bus 921 through a non-removable memory interface such as interface 940, and USB drive 951 is typically connected to the system bus 921 by a removable memory interface, such as interface 950.

The drives and their associated computer storage media discussed above and illustrated in FIG. 8, provide storage of computer readable instructions, data structures, other executable software and other data for the computing system 900. In FIG. 8, for example, the solid state memory 941 is illustrated for storing operating system 944, application programs 945, other executable software 946, and program data 947. Note that these components can either be the same as or different from operating system 934, application programs 935, other executable software 936, and program data 937. Operating system 944, application programs 945, other executable software 946, and program data 947 are given different numbers here to illustrate that, at a minimum, they are different copies.

A user may enter commands and information into the computing system 900 through input devices such as a keyboard, touchscreen, or software or hardware input buttons 962, a microphone 963, a pointing device and/or scrolling input component, such as a mouse, trackball or touch pad. The microphone 963 can cooperate with speech recognition software. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a hand-held device, a server, a router, a network PC, a peer device or other common network node, and typically includes many or all of the elements described above relative to the computing system 900. The logical connections depicted in FIG. 8 can include a personal area network ("PAN") 972 (e.g., Bluetooth®), a local area network ("LAN") 971 (e.g., Wi-Fi), and a wide area network ("WAN") 973 (e.g., cellular network), but may also include other networks. Such networking environments are commonplace in offices, enterprise-wide computer networks, intranets and the Internet. A browser application may be resident on the computing device and stored in the memory.

When used in a LAN networking environment, the computing system 900 is connected to the LAN 971 through a network interface or adapter 970, which can be, for example, a Bluetooth® or Wi-Fi adapter. When used in a WAN networking environment (e.g., Internet), the computing system 900 typically includes some means for establishing communications over the WAN 973. With respect to mobile telecommunication technologies, for example, a radio interface, which can be internal or external, can be connected to the system bus 921 via the network interface 970, or other appropriate mechanism. In a networked environment, other software depicted relative to the computing system 900, or portions thereof, may be stored in the remote memory storage device. By way of example, and not limitation, FIG. 8 illustrates remote application programs 985 as residing on remote computing device 980. It will be appreciated that the network connections shown are examples and other means of establishing a communications link between the computing devices may be used.

As discussed, the computing system 900 can include a processor 920, a memory (e.g., ROM 931, RAM 932, etc.), a built in battery to power the computing device, an AC power input to charge the battery, a display screen, a built-in Wi-Fi circuitry to wirelessly communicate with a remote computing device connected to network.

It should be noted that the present design can be carried out on a computing system such as that described with respect to FIG. 8. However, the present design can be carried out on a server, a computing device devoted to message handling, or on a distributed system in which different portions of the present design are carried out on different parts of the distributed computing system.

Another device that may be coupled to bus 921 is a power supply such as a DC power supply (e.g., battery) or an AC adapter circuit. As discussed above, the DC power supply may be a battery, a fuel cell, or similar DC power source that needs to be recharged on a periodic basis. A wireless communication module can employ a Wireless Application Protocol to establish a wireless communication channel. The wireless communication module can implement a wireless networking standard.

In an embodiment, software used to facilitate algorithms discussed herein can be embodied onto a non-transitory machine-readable medium. A machine-readable medium includes any mechanism that stores information in a form readable by a machine (e.g., a computer). For example, a non-transitory machine-readable medium can include read only memory (ROM); random access memory (RAM); magnetic disk storage media; optical storage media; flash memory devices; Digital Versatile Disc (DVD's), EPROMs, EEPROMs, FLASH memory, magnetic or optical cards, or any type of media suitable for storing electronic instructions.

Note, an application described herein includes but is not limited to software applications, mobile apps, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as C, C+, or other similar languages. Also, an algorithm can be implemented with lines of code in software, configured logic gates in software, or a combination of both. In an embodiment, the logic consists of electronic circuits that follow the rules of Boolean Logic, software that contain patterns of instructions, or any combination of both.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

Many functions performed by electronic hardware components can be duplicated by software emulation. Thus, a software program written to accomplish those same functions can emulate the functionality of the hardware components in input-output circuitry.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

What is claimed is:

1. An apparatus, comprising:
   an Artificial Intelligence ("AI") engine having multiple independent modules on one or more computing platforms, where the multiple independent modules are configured to have their instructions executed by one or more processors in the one or more computing platforms, and the multiple independent modules are configured to be loaded into one or more memories of the one or more computing platforms;
   where an architect module is configured to create a number of nodes and how the nodes are connected in a graph of concept nodes that make up a resulting AI model, where the graph of concept nodes is derived from a description in one or more scripted files, where the architect module is configured to create a first concept node by wrapping an external entity of code into a software container with an interface configured to exchange information in a protocol of a software language used by the external entity of code, where one or more external entities of code are selected from a group consisting of i) an external AI model coded in different software language natively used by a resulting AI model, ii) an external function having some defined input and output that is coded in different software language natively used by a resulting AI model, iii) a block of code using a ReST API, iv) an already trained AI model coded in the software language natively used by the resulting AI model, and v) any combination of these;
   where the architect module is also configured to create a second concept node derived from its description in a first scripted file, and to connect the second concept node into the graph of nodes in the resulting AI model,
   where a re-use of the external entity of code as the first concept node in the graph making up the resulting AI model allows a creation and training of the resulting AI model with less computing cycles in the AI engine than creating and training all of the concept nodes in the resulting AI model from scratch; and
   where the second concept node, coded by the architect module and that needs to be trained, allows deployment of the first concept node embodied in the external entity of code with i) new functionality, ii) extended functionality or iii) a combination of both when combined in the resulting AI model.

2. The apparatus of claim 1, where the AI engine is configured to use a first file to map the interface of the software container between an external entity of code and the corresponding Application Programming Interface for the AI engine, where the first file maps the external entity of code and its data flow into the graph of nodes making up the resulting AI model.

3. The apparatus of claim 1, where the AI engine is configured to allow import of the external entity of code in order to containerize the external entity of code via the architect module in the AI engine, where the container for the external entity of code is coded to make the entity of code callable from trained AI models as a concept node in the graph of nodes, where the container for the external entity of code is also coded to make the entity of code callable from AI models undergoing training within that graph of nodes in the resulting AI model.

4. The apparatus of claim 1, where the resultant AI model is configured, after its initial training of all of the individual concept nodes making up the AI model, to allow individual concept nodes to be replaced without having to retraining other concepts in the graph of concept nodes making up the resulting AI model; and thus, an older version of the first concept node can be replaced with a new version of the first concept node without having to retrain any of the other concepts in the graph of concept nodes making up the resulting AI model.

5. The apparatus of claim 1, where an interface infrastructure the AI engine is extended to allow uploading of user code and data from their local development environment into the AI engine learning framework, via the user files specified in a second file associated with the container, where the second files is configured to map to resources, internal and/or external to the AI engine, to be used by the external entity of code.

6. The apparatus of claim 1, where the AI engine is configured to have one or more schema relationships including dataflow operations stored in a database with their interfaces to interact with the external entities of code and corresponding management module to automate the dataflow; and thus, a software coding for the AI engine is extended to support describing the interfaces and relationships between external entities of code and the other scripted concept nodes contained within the resulting AI model.

7. The apparatus of claim 1, where the description including its functionality in the first scripted file of the second concept by the architect module is coded in a first software language of a pedagogical programming language and the first concept node correlating to the external entity of code is created in a second software language, and the first concept node and second concept node are contained in the same graph of nodes in the resulting AI model.

8. The apparatus of claim 1, where the external entity of code is integrated by a learned integrator controller into the graph of nodes as the first concept node that makes up the resulting artificial intelligence model, where the learned integrator controller is configured to combine a heterogeneous mix of concept nodes including the second concept node derived from the description in the scripted file that needs to be trained and is coded by the architect module, with the first concept of the external entity of code that includes a classical controller or an already trained AI model into a complete overall problem solution contained within the resulting AI model, where the graph of nodes of the resulting AI model is hierarchical and consists of nodes that are two or more layers deep.

9. The apparatus of claim 1, where the AI engine has a user interface configured to allow a user to i) insert transformations between concept nodes the graph of nodes, ii) connect pre-existing trained models to or into the resulting AI model, iii) connect any other data-driven services as needed, and iv) any combination of these.

10. The apparatus of claim 1, where the external entity of code is an already coded perception AI model or an already coded prediction AI model, and the second concept node is a new function or extended function for the perception AI model or prediction AI model, which is to be trained by a second module in the AI engine with reinforcement learning technology to form different concept nodes in the resulting AI model.

11. A non-transitory computer-readable medium including executable instructions that, when executed on a computer system with one or more processors, cause the computer system to perform the following steps, comprising:

instantiating an Artificial Intelligence ("AI") engine having multiple independent modules on one or more computing platforms, where the multiple independent modules are configured to have their instructions executed by one or more processors in the one or more computing platforms, and the multiple independent modules, including an architect module, are configured to be loaded into one or more memories of the one or more computing platforms, wherein, upon execution instructions for the architect module by the one or more processors, the architect module is configured to create a number of nodes and how the nodes are connected in a graph of concept nodes that make up a resulting AI model, where the graph of concept nodes is derived from a description in one or more scripted files, where the architect module is configured to create a first concept node by wrapping an external entity of code into a software container with an interface configured to exchange information in a protocol of a software language used by the external entity of code, where one or more external entities of code are selected from a group consisting of i) an external AI model coded in different software language natively used by a resulting AI model, ii) an external function having some defined input and output that is coded in different software language natively used by a resulting AI model, iii) a block of code using a ReST API, iv) an already trained AI model coded in the software language natively used by the resulting AI model, and v) any combination of these;

wherein, upon execution of the architect module by the one or more processors, the architect module is configured to create a second concept node in the graph of nodes that is derived from its description in a first scripted file, and where the second concept node is also connected into the graph of nodes in the resulting AI model; where a re-use of the external entity of code as the first concept node in the graph making up the resulting AI model allows a creation and training of the resulting AI model with less computing cycles in the AI engine than creating and training all of the concept nodes in the resulting AI model from scratch; and where the second concept node, coded by the architect module and that needs to be trained, allows deployment of the first concept node embodied in the external entity of code with i) new functionality, ii) extended functionality or iii) a combination of both when combined in the resulting AI model.

12. The non-transitory computer-readable medium of claim 11 including executable instructions that, when executed on a computer system with one or more processors, cause the computer system to perform the following steps, where the AI engine is configured to use a first file to map the interface of the software container between an external entity of code and the corresponding Application Programming Interface for the AI engine, where the first file maps the external entity of code and its data flow into the graph of nodes making up the resulting AI model.

13. The non-transitory computer-readable medium of claim 11 including executable instructions that, when executed on a computer system with one or more processors, cause the computer system to perform the following steps, where the AI engine is configured to allow import of the external entity of code in order to containerize the external entity of code via the architect module in the AI engine, where the container for the external entity of code is coded to make the entity of code callable from trained AI models as a concept node in the graph of nodes, where the container for the external entity of code is also coded to make the entity of code callable from AI models undergoing training within that graph of nodes in the resulting AI model.

14. The non-transitory computer-readable medium of claim 11 including executable instructions that, when executed on a computer system with one or more processors, cause the computer system to perform the following steps, where the resultant AI model is configured, after its initial training of all of the individual concept nodes making up the AI model, to allow individual concept nodes to be replaced without having to retraining other concepts in the graph of concept nodes making up the resulting AI model; and thus, an older version of the first concept node can be replaced with a new version of the first concept node without having to retrain any of the other concepts in the graph of concept nodes making up the resulting AI model.

15. The non-transitory computer-readable medium of claim 11 including executable instructions that, when executed on a computer system with one or more processors, cause the computer system to perform the following steps, where an interface infrastructure the AI engine is extended to allow uploading of user code and data from their local development environment into the AI engine learning framework, via the user files specified in a second file associated with the container, where the second files is configured to map to resources, internal and/or external to the AI engine, to be used by the external entity of code.

16. The non-transitory computer-readable medium of claim 11 including executable instructions that, when executed on a computer system with one or more processors, cause the computer system to perform the following steps, where the AI engine is configured to have one or more schema relationships including dataflow operations stored in a database with their interfaces to interact with the external entities of code and corresponding management module to automate the dataflow; and thus, a software coding for the AI engine is extended to support describing the interfaces and relationships between external entities of code and the other scripted concept nodes contained within the resulting AI model.

17. The non-transitory computer-readable medium of claim 11 including executable instructions that, when executed on a computer system with one or more processors, cause the computer system to perform the following steps, where the description including its functionality in the first scripted file of the second concept by the architect module is coded in a first software language of a pedagogical programming language and the first concept node correlating to the external entity of code is created in a second software language, and the first concept node and second concept node are contained in the same graph of nodes in the resulting AI model.

18. The non-transitory computer-readable medium of claim 11 including executable instructions that, when executed on a computer system with one or more processors, cause the computer system to perform the following steps, where the external entity of code is integrated by a learned integrator controller into the graph of nodes as the first concept node that makes up the resulting artificial intelligence model, where the learned integrator controller is configured to combine a heterogeneous mix of concept nodes including the second concept node derived from the description in the scripted file that needs to be trained and is coded by the architect module, with the first concept of the external entity of code that includes a classical controller or an already trained AI model into a complete overall problem solution contained within the resulting AI model, where the graph of nodes of the resulting AI model is hierarchical and consists of nodes that are two or more layers deep.

19. The non-transitory computer-readable medium of claim 11 including executable instructions that, when executed on a computer system with one or more processors, cause the computer system to perform the following steps, where the AI engine has a user interface configured to allow a user to i) insert transformations between concept nodes the graph of nodes, ii) connect pre-existing trained models to or into the resulting AI model, iii) connect any other data-driven services as needed, and iv) any combination of these.

20. The non-transitory computer-readable medium of claim 11 including executable instructions that, when executed on a computer system with one or more processors, cause the computer system to perform the following steps, where the external entity of code is an already coded perception AI model or an already coded prediction AI model, and the second concept node is a new function or extended function for the perception AI model or prediction AI model, which is to be trained by a second module in the AI engine with reinforcement learning technology to form different concept nodes in the resulting AI model.

* * * * *